(12) United States Patent
Naylor et al.

(10) Patent No.: US 12,266,720 B2
(45) Date of Patent: Apr. 1, 2025

(54) TRANSISTORS WITH MONOCRYSTALLINE METAL CHALCOGENIDE CHANNEL MATERIALS

(71) Applicant: Intel Corporation, Santa Clara, CA (US)

(72) Inventors: Carl Naylor, Portland, OR (US);
Chelsey Dorow, Portland, OR (US);
Kevin O'Brien, Portland, OR (US);
Sudarat Lee, Hillsboro, OR (US);
Kirby Maxey, Hillsboro, OR (US);
Ashish Verma Penumatcha, Beaverton, OR (US); Tanay Gosavi, Portland, OR (US); Patrick Theofanis, Portland, OR (US); Chia-Ching Lin, Portland, OR (US); Uygar Avci, Portland, OR (US); Matthew Metz, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 920 days.

(21) Appl. No.: 17/129,486

(22) Filed: Dec. 21, 2020

(65) Prior Publication Data
US 2022/0199812 A1   Jun. 23, 2022

(51) Int. Cl.
*H01L 29/76* (2006.01)
*H01L 21/02* (2006.01)
(Continued)

(52) U.S. Cl.
CPC .... *H01L 29/7606* (2013.01); *H01L 21/02568* (2013.01); *H01L 21/8256* (2013.01); *H01L 27/092* (2013.01); *H01L 29/24* (2013.01)

(58) Field of Classification Search
CPC .......... H01L 29/7606; H01L 21/02568; H01L 21/8256; H01L 27/092; H01L 29/24; H01L 21/02557; H01L 21/0256; H01L 21/02562
See application file for complete search history.

(56) References Cited

U.S. PATENT DOCUMENTS 5,718,761 A * 2/1998 Tokunaga ........... H01L 21/0256
438/479
6,140,672 A    10/2000 Arita et al.
(Continued)

FOREIGN PATENT DOCUMENTS

KR   20100053230   5/2010
WO   2018182607   10/2018

OTHER PUBLICATIONS

Extended European Search Report from European Patent Application No. 21197591.7 notified Mar. 14, 2022, 7 pgs.
(Continued)

*Primary Examiner* — Julia Slutsker
(74) *Attorney, Agent, or Firm* — Essential Patents Group, LLP

(57) ABSTRACT

Transistor structures with monocrystalline metal chalcogenide channel materials are formed from a plurality of template regions patterned over a substrate. A crystal of metal chalcogenide may be preferentially grown from a template region and the metal chalcogenide crystals then patterned into the channel region of a transistor. The template regions may be formed by nanometer-dimensioned patterning of a metal precursor, a growth promoter, a growth inhibitor, or a defected region. A metal precursor may be a metal oxide suitable, which is chalcogenated when exposed to a chalcogen precursor at elevated temperature, for example in a chemical vapor deposition process.

12 Claims, 17 Drawing Sheets

(51) Int. Cl.
*H01L 21/8256* (2006.01)
*H01L 27/092* (2006.01)
*H01L 29/24* (2006.01)

(56) References Cited

U.S. PATENT DOCUMENTS

| | | |
|---|---|---|
| 6,339,241 B1 | 1/2002 | Mandelman et al. |
| 6,392,917 B1 | 5/2002 | Kang |
| 6,404,667 B1 | 6/2002 | Yoo |
| 6,700,133 B1 | 3/2004 | Ohtani et al. |
| 6,873,029 B2 | 3/2005 | He et al. |
| 7,919,800 B2 | 4/2011 | Gonzalez et al. |
| 8,258,498 B2 | 9/2012 | Majhi et al. |
| 8,395,191 B2 | 3/2013 | Or-Bach et al. |
| 9,263,527 B2 | 2/2016 | Yamada et al. |
| 9,576,960 B2 | 2/2017 | Khakifirooz et al. |
| 9,673,285 B2 | 6/2017 | Simin et al. |
| 9,991,268 B1 | 6/2018 | Liaw |
| 10,084,058 B2 | 9/2018 | Majhi et al. |
| 10,224,279 B2 | 3/2019 | Or-Bach et al. |
| 10,312,289 B1 | 6/2019 | Ota et al. |
| 11,171,243 B2 | 11/2021 | Dewey et al. |
| 11,282,963 B2 | 3/2022 | Ahmed |
| 11,355,505 B2 | 6/2022 | Morris et al. |
| 2003/0132470 A1 | 7/2003 | Joshi et al. |
| 2005/0236622 A1 | 10/2005 | Jung et al. |
| 2007/0155067 A1 | 7/2007 | Park et al. |
| 2009/0146141 A1 | 6/2009 | Song et al. |
| 2010/0038743 A1 | 2/2010 | Lee |
| 2010/0110758 A1 | 5/2010 | Li et al. |
| 2010/0224873 A1 | 9/2010 | Sakata et al. |
| 2011/0121266 A1 | 5/2011 | Majhi et al. |
| 2011/0168993 A1 | 7/2011 | Jeon et al. |
| 2012/0003808 A1 | 1/2012 | Lee |
| 2012/0319728 A1 | 12/2012 | Madurawe |
| 2013/0264620 A1 | 10/2013 | Yu et al. |
| 2013/0292702 A1 | 11/2013 | Horii |
| 2014/0009998 A1 | 1/2014 | Schloss et al. |
| 2014/0145272 A1 | 5/2014 | Or-Bach et al. |
| 2014/0183637 A1 | 7/2014 | Cohen et al. |
| 2015/0171167 A1 | 6/2015 | Nourbakhsh et al. |
| 2015/0179786 A1 | 6/2015 | Kim et al. |
| 2015/0249096 A1 | 9/2015 | Lupino et al. |
| 2015/0255139 A1 | 9/2015 | Atsumi et al. |
| 2015/0364565 A1 | 12/2015 | Ramaswamy et al. |
| 2016/0056039 A1 | 2/2016 | Kim et al. |
| 2016/0056249 A1 | 2/2016 | Kleemeier et al. |
| 2016/0204277 A1 | 7/2016 | Yang et al. |
| 2016/0225915 A1 | 8/2016 | Qiu et al. |
| 2016/0359062 A1 | 12/2016 | Heo et al. |
| 2016/0365372 A1 | 12/2016 | Li et al. |
| 2017/0133375 A1 | 5/2017 | Fung |
| 2017/0162702 A1 | 6/2017 | Hu |
| 2017/0200744 A1 | 7/2017 | Giles et al. |
| 2017/0358598 A1 | 12/2017 | Bedeschi |
| 2018/0090309 A1* | 3/2018 | Robinson .......... H01L 21/02612 |
| 2018/0130785 A1 | 5/2018 | Wang et al. |
| 2018/0226248 A1 | 8/2018 | Jahangir et al. |
| 2018/0226509 A1 | 8/2018 | Karpov et al. |
| 2019/0027535 A1 | 1/2019 | Kumar et al. |
| 2019/0164754 A1* | 5/2019 | Kim .................. H01L 21/02568 |
| 2019/0267319 A1 | 8/2019 | Sharma et al. |
| 2019/0287858 A1 | 9/2019 | Dasgupta et al. |
| 2019/0371892 A1* | 12/2019 | Lee .................. H01L 21/02507 |
| 2020/0098564 A1* | 3/2020 | Li ..................... H01L 21/02433 |
| 2020/0119174 A1* | 4/2020 | Merckling ........ H01L 21/02639 |
| 2020/0135921 A1 | 4/2020 | Chiang |
| 2020/0258884 A1 | 8/2020 | Rachmady et al. |
| 2020/0350440 A1 | 11/2020 | Gao et al. |
| 2020/0357814 A1 | 11/2020 | Kim et al. |
| 2022/0052200 A1 | 2/2022 | Dewey et al. |

OTHER PUBLICATIONS

Zubko, P., et al., "Ferroelectric Domains in PbTiO3/SrTiO3 Superlattices", Ferroelectrics, vol. 433, No. 1, Sep. 12, 2012, pp. 127-137.
Kim, Se-Yang et al., "Recent Developments in Controlled Vapor-Phase Growth of Two-Dimensional Group 6 Transition Metal Dichalcogenides", Advanced Materials, vol. 31, Issue 20, Feb. 2019, 90 pgs.

* cited by examiner

TRANSISTORS WITH MONOCRYSTALLINE METAL CHALCOGENIDE CHANNEL MATERIALS

BACKGROUND

Many advanced semiconductor devices in development leverage non-silicon semiconductor materials. One class of those materials is transition metal chalcogenides (e.g., TMD or TMDC). TMDCs display semiconductor properties as a unit cell of $MX_2$, where M is a transition metal atom (e.g., Mo, W) and X is a chalcogen atom (S, Se, or Te). TMDC materials have been of significant interest in highly-scaled integrated circuitry (IC), in part because of the thin active layers possible. It has also been shown that many TMDC materials have good electron mobility and hole mobility, making them interesting for complementary short channel devices (e.g., $L_g$<20 nm).

However, TMDC material synthesis has to date relied upon growth of continuous thin films that tend to be of poor quality, for example, with many grain boundaries and/or of varied thicknesses. TMDC material synthesis techniques suitable for high volume manufacturing, and device structures with higher quality TMDC channel material are therefore commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
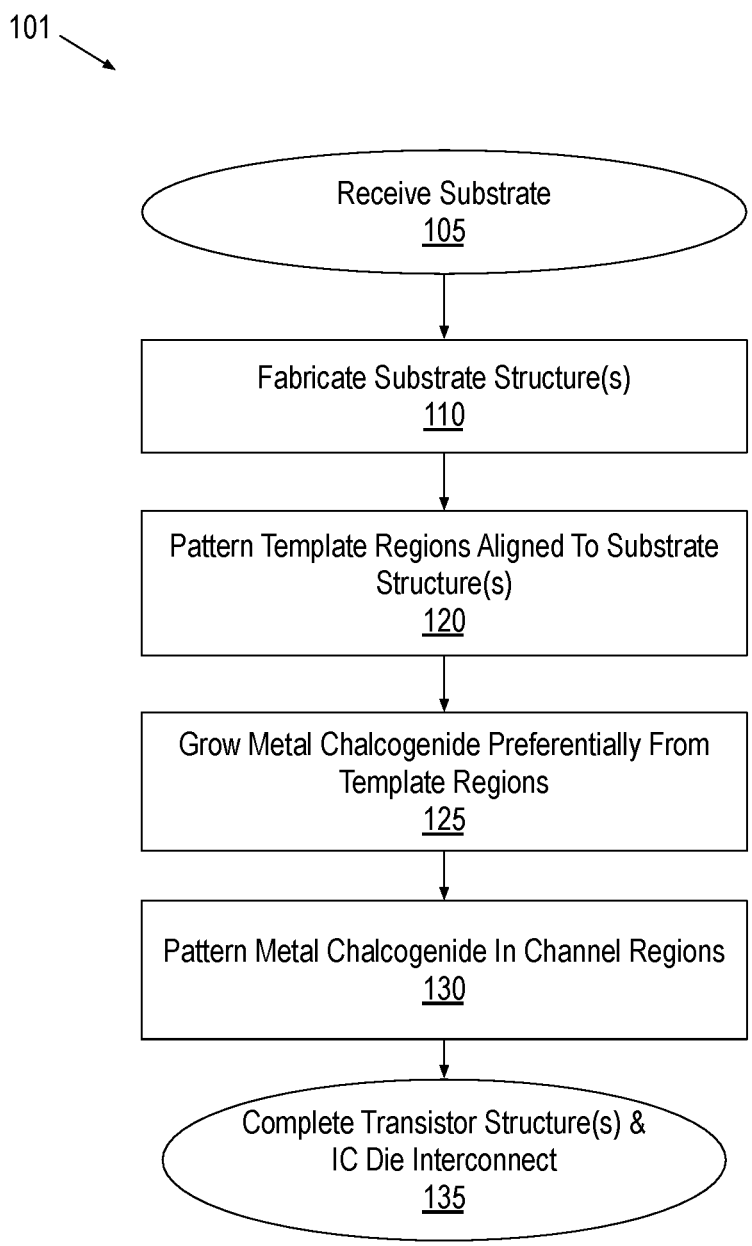
FIG. 1 is a flow diagram illustrating methods of fabricating transistor structures including a metal chalcogenide channel region formed by preferential growth from nanometer-dimensioned template regions, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are transistor structures including monocrystalline metal chalcogenide channel materials, and methods of fabricating such structures. In accordance with embodiments herein, rather than growing a continuous film over a growth substrate, single crystals of metal chalcogenide semiconductor material are preferentially grown at specific predetermined locations dictated by the patterning of template regions. The template regions may advantageously have nanometer dimensions and with a pitch matched to the pitch of transistor structures that are to include the metal chalcogenide as a channel region. A template region may by a solid-state precursor of the metal, for example. In other examples, a template region may be a defected region of a substrate material, a region of growth promoter, or a region free of growth inhibitor.

Template regions may function as nucleation points so that single crystal of metal chalcogenide material can grow at a predetermined location over a substrate surface. By practicing templating techniques in accordance with embodiments herein, many transistors, all of which have a monocrystalline TMD channel, may be fabricated without first growing a very large single crystal (e.g., of growth substrate dimensions), much which is ultimately discarded through subtractive patterning. Hence, grain location is precisely controlled instead of attempting expansive grain growth. By treating the growth of metal chalcogenide as a selective transistor-level additive process, crystal grain dimensions on the same order as the footprint (area) of as little as a single transistor structure may suffice for very large scale integration of transistors with monocrystalline channel material. While the paradigms described herein are described with examples suitable for chemical vapor deposition (CVD), the paradigms are nevertheless suitable to other metal chalcogenide growth techniques, such as, but not limited to, molecular beam epitaxy (MBE). As described further below, a CVD growth process may include a metalorganic precursor (i.e., MOCVD), or not, depending on the composition of the template region.

FIG. 1 is a flow diagram illustrating fabrication methods 101, in accordance with some exemplary embodiments. Methods 101 begin at block 105 where a substrate is received. In some embodiments the substrate is as a large format (e.g., 300-450 mm) wafer. The wafer may include a Group IV semiconductor material layer (e.g., Si, Ge, SiGe, GeSn, etc.), a Group III-V semiconductor material layer, or a Group II-VI semiconductor material layer, for example.

At block 110, one or more substrate structures are fabricated in the substrate. These substrate structures may include structures that will be part of transistors that include metal chalcogenide channel material. For example, one or more FET terminals may be fabricated into the substrate at block 110. Such terminals may be any of a gate terminal (electrode), source terminal, or drain terminal. Any terminals fabricated at block 110 are "bottom" terminals that will be below, or under, channel material of the FETs. Bottom gate or bottom source/drain terminals may be embedded within any suitable dielectric material. Although bottom terminal fabrication at block 110 may be advantageous for higher device density, bottom terminals need not be fabricated at block 110 with all FET terminals instead being top-side terminals fabricated over the channel material.

Substrate structures fabricated at block 110 may also include front-end-of-line (FEOL) transistors and FEOL metallization coupled to the FEOL transistors. For example, in some embodiments, FEOL FETs may be fabricated into a semiconductor layer of the substrate. Such FEOL FETs may be of any architecture and been fabricated using any technique. One or more metallization levels may also be fabricated at block 110, for example to couple FEOL FETs as FEOL circuitry. In some examples, FEOL FETs include both n-type and p-type FETs interconnected into CMOS FEOL circuitry. Any bottom terminals also fabricated at block 110 may be coupled to any underlying FEOL circuitry.

One or more substrate materials may be on the surface of the substrate following block 110. In some exemplary embodiments, a substantially amorphous material is on the substrate surface at the completion of block 110. An amorphous material over the entirety of the substrate surface may advantageously provide a uniform surface chemistry regardless of what underlying substrate structures have been fabricated at block 110.

Methods 101 continue at block 120 where template regions are patterned over the surface of the substrate. Template regions are to control the spontaneity of metal chalcogenide grain growth such that crystallization of the metal chalcogenide will occur preferentially at predetermined locations. The growth locations, as well as the lateral dimensions of the template regions are to be precisely controlled, for example through photolithographic techniques, such as, but not limited to DUV (193 nm), or EUV (13.5 nm) lithography. In exemplary embodiments, locations of the template regions formed at block 120 are aligned to one or more of the substrate structures fabricated at block 110. In some embodiments, for example, the template regions formed at block 120 are lithographically aligned to a bottom gate or bottom source/drain terminal that was fabricated at block 110. The alignment to such substrate structures is advantageously with nanometer (not micron) precision. Lateral dimensions of the template regions are similarly on the order of a few tens of nanometers. In some embodiments, for example, the template regions have a largest lateral dimension below 50 nm.

As described further below, for example in the context of FIG. 2A, template regions may be formed at block 120 by depositing a precursor material comprising a metal that is to be chalcogenated. The precursor material may be deposited, for example, as a continuous film, and then subtractively patterned to remain only in template regions. The metal precursor material may be consumed through chalcogenation reactions during a subsequent metal chalcogenide growth at block 125. The patterning process at block 120 may therefore provide a precise dosing of the metal precursor, with a precise areal density of the metal precursor over the workpiece surface, and with a precise positioning of the metal precursor relative to the underlying substrate structures. Alternatively, if there is heterogeneity in the substrate material surface (e.g., that may have resulted from one or more patterning processes performed at block 110), the metal precursor may be selectively deposited only in the template regions as a function of the surface heterogeneity.

In other embodiments, template regions are defined at block 120 by introducing defects into the surface of the substrate material, for example as further described below in the context of FIG. 2B. For such embodiments, one or more patterning processes performed at block 120 may precisely position defected regions to the underlying substrate structures, and these defected regions may serve as nucleation sites for a subsequent metal chalcogenide growth. These predetermined nucleation sites may ensure grain growth of metal chalcogenide material subsequently formed at block 125 will begin at locations that ensure transistors encompassing those locations will have a high likelihood of including only a single grain of metal chalcogenide material.

In other embodiments, template regions are defined at block 120 by patterning a metal chalcogenide growth promoter over the surface of the substrate material. In contrast to precursor embodiments, the growth promoter does not include a constituent of the metal chalcogenide that is subsequently grown at block 125, but rather is to locally alter the surface chemistry of the substrate material so that it may serve as a nucleation site. In some examples further described below in the context of FIG. 2C, a patterned metal chalcogenide growth promoter is to remain only within nanometer-dimensioned template regions. Alternatively, if there is heterogeneity in the substrate material surface, the growth promoter may be selectively deposited only in the template regions as a function of the surface heterogeneity (which may have been previously defined by one or more patterning processes performed at block 110).

In other embodiments, template regions are defined at block 120 by patterning a metal chalcogenide growth inhibitor over the surface of the substrate material. Growth inhibition embodiments are complementary to growth promoter embodiments. Patterning of the template regions at block 120 may therefore entail a bright field pattern of growth promoter regions or a dark field pattern of growth inhibitor regions where an uninhibited substrate surface remains only within the template regions.

In further embodiments, two or more of the above techniques are combined. For example, a growth promoter/inhibitor pattern may be defined in addition to patterned defected regions and/or patterned metal precursors. Two examples enlisting multiple techniques for inducing a spatially controlled preferential growth of metal chalcogenide are described in the context of FIG. 3A and 3B.

With nanometer-dimensioned template regions defined, methods 101 continue at block 125 where a metal chalcogenide is grown preferentially from the patterned template regions. The metal chalcogenide growth at block 125 is semiconducting and may be suitable as a channel material for either a p-type or n-type transistor. The metal chalcogenide growth at block 125 preferentially initiates within a template region and the growth front then propagates away from the template structure. Hence, the nanometer dimensions of the template regions may advantageously limit the surface area of the template region so that an initial grain may more rapidly enclose the template structure.

The metal chalcogenide materials grown at block 125 may be a dichalcogenide ($MC_2$). However, a number of oxidation states are possible such that the resulting compound is better characterized as $MC_x$. In some advantageous embodiments, x is between 0.2 and 4. For embodiments herein, chalcogens include at least one of sulfur, selenium or tellurium (oxygen is excluded), with S or Se being particularly advantageous. The metal chalcogenide may therefore be $MS_x$, $MSe_x$, or $MTe_x$, for example. In some embodiments, metal M is Cu, Zn, Zr, Re, Hf, Ir, Ru, Cd, Ni, Co, Pd, Pt, Ti, Cr, V, W Mo, Al, Sn, Ga, In, B, Ge, Si, P, As, or Sb. The metal chalcogenide formed at block 125 may be predominantly one of these metals and one or more of the chalcogens. For example, the metal chalcogenide may be any of $CuS_x$, $CuSe_x$, $CuTe_x$, $ZnS_x$, $ZnSe_x$, $ZnTe_x$, $ZrS_x$, $ZrSe_x$, $ZrTe_x$, $ReS_x$, $ReSe_x$, $TeSe_x$, $RuS_x$, $RuSe_x$, $RuTe_x$, $IrS_x$, $IrSe_x$, $IrTe_x$, $CdS_x$, $CdSe_x$, $CdTe_x$, $NiS_x$, $NiSe_x$, $NiTe_x$, $CoS_x$, $CoSe_x$, $CoTe_x$, $PdS_x$, $PdSe_x$, $PtSe_x$, $PtS_x$, $PtSe_x$, $PtTe_x$, $TiS_x$, $TiSe_x$, $TiTe_x$, $CrS_x$, $CrSe_x$, $CrTe_x$, $VS_x$, $VSe_x$, $VTe_x$, $WS_x$, $WSe_x$, $WTe_x$, $MoS_x$, $MoSe_x$, $MoTe_x$, $AlS_x$, $AlSe_x$, $AlTe_x$, $SnS_x$, $SnSe_x$, $SnTe_x$, $GaS_x$, $GaSe_x$, $GaTe_x$, $InS_x$, $InSe_x$, $InTe_x$, $SbS_x$, $SbSe_x$, $SbTe_x$, $GeS_x$, $GeSe_x$, $GeTe_x$, $SiS_x$, $SiSe_x$, or $SiTe_x$. In further embodiments, the metal includes multiple metals as M1M2 or M1M2M3 alloys along with one or more of S, Se, or Te. For example, the metal chalcogenide formed at block 125 may be $InGaZnSe_x$.

The metal chalcogenide may be formed at block 125, for example, by CVD with the introduction of at least a chalcogen precursor. In some exemplary embodiments, block 125 entails a thermal process performed in the presence of a precursor comprising S, Se or Te. In some examples, the substrate is heated to over 200° C. (e.g., 250-1000° C.) in the presence of a chalcogen precursor gas, such as $H_2S$, $H_2Se$, or $H_2Te$. As these exemplary precursors can also act as strong reducing agents, they may be combined or replaced with weaker reducing agents/stronger oxidizing agents. For example, in some embodiments $SO_2$ or $SeO_2$ is introduced in combination with, or to the exclusion of, $H_2S$ or $H_2Se$, respectively. Other gases, such as, $NH_3$, $SF_6$, $N_2$, Ar, $N_2O$ may also be introduced in combination with one or more of $H_2S$ and $SO_2$, $H_2Se$ and $SeO_2$, or $H_2Te$ with gases lacking oxygen tempering the reducing strength somewhat less than those that introduce oxygen.

The growth process may further include a vapor or liquid source of one or more metals, in addition to the chalcogen precursor. For example, a metal precursor introduced at block 125 may be the only source of metal if the template regions do not comprise a metal precursor. A same or different metal precursor may also be introduced if the template regions do comprise a metal precursor, for example to supplement a metal in template regions, or to alloy with it. If a metal is to be introduced during the growth at block 125, the precursor is advantageously a metalorganic, and the CVD process practiced at block 125 is more specifically an MOCVD growth process. Although vapor/gas metalorganic sources are advantageous, liquid metalorganic precursors may also be used, for example with an MOCVD growth process that utilizes a bubbler.

Following block 125, growth promoter, inhibitor, and/or residue metal precursor may be stripped off, or left as a permanent feature of a transistor structure. The preferential growth of the metal chalcogenide at block 125 will result in a number of grains of metal chalcogenide material over the substrate surface. These grains may or may not have grown to intersect each other, for example depending on the pitch of the template structures and the duration of the metal chalcogenide growth process. The various grains may then be patterned at block 120, for example with a subtractive process, into nanometer dimensioned channel regions. The channel regions may be lithographically defined with a mask aligned to the template regions and/or with lower level substrate structures. Any etch process, e.g., reactive ion etch (RIE), vapor, or wet chemical etch) may be practiced at block 130 as embodiments are not limited in this respect.

With the channel regions defined, methods 101 may complete at block 135 where any transistor terminals not yet formed are fabricated according to any suitable techniques. Being over the channel materials, the terminals formed at block 135 are referred to herein as "top" terminals. Following the completion of methods 101, one or more levels of metallization may be fabricated over the transistor structures to interconnect them into integrated circuitry.

Figure 2A:
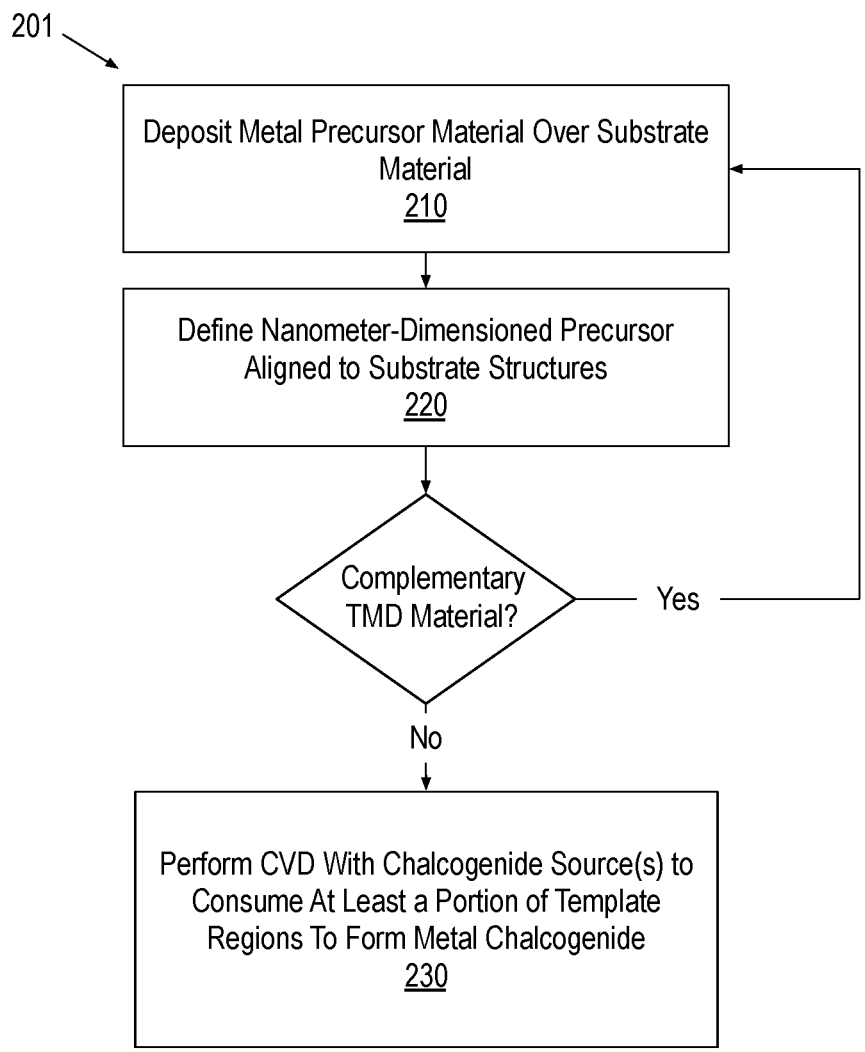
FIG. 2A is a flow diagram illustrating methods of fabricating transistor structures including a metal chalcogenide channel region formed through chalcogenation of a nanometer-dimensioned metal precursor, in accordance with some embodiments of the methods introduced in FIG. 1.

FIG. 2A is a flow diagram illustrating methods 201 for fabricating transistor structures including a metal chalcogenide channel region formed through chalcogenation of a nanometer-dimensioned metal precursor, in accordance with some embodiments of methods 101.

Methods 201 begin at block 210 where a metal precursor is deposited over the substrate material. In exemplary embodiments, the metal precursor is a metal oxide (i.e., comprising predominantly a metal and oxygen). The metal oxide deposited at block 210 may be a suboxide ($A_2O$), monoxide (AO), binary oxide ($AO_2$), ternary oxide ($ABO_3$), or mixture thereof (e.g., where a linear mixture variable x may range between 1 and 2). The metal oxide is advantageously a conductive material, but may also be a semiconductor or dielectric depending on composition. Although any of the metals described above may be deposited at block 210, in some specific examples $WO_x$ is deposited. In other exemplary embodiments $MoO_x$ or $CuO_x$ is deposited.

The precursor material may be deposited, for example, as a thin film with any suitable deposition technique. In some embodiments, a metal precursor is deposited by physical vapor deposition (PVD), molecular beam deposition (MBD), or MOCVD. The precursor material is advantageously deposited to a film thickness controlled to tens or hundreds of monolayers, for example. In some embodiments, the metal precursor is deposited to a thickness of 5-15 nm. A CVD process may further comprise atomic layer deposition (ALD) techniques with cyclical half-reactions to achieve a thin film thickness somewhat more tightly controlled than for metallic embodiments that are not self-limited to integer monolayers. Metal oxide precursor film thickness may therefore range from as little as 2-3 monolayers of metal oxide to more than 10 nm. ALD deposition process(es) performed at block 210 may be area selective, or not.

Figure 4A:
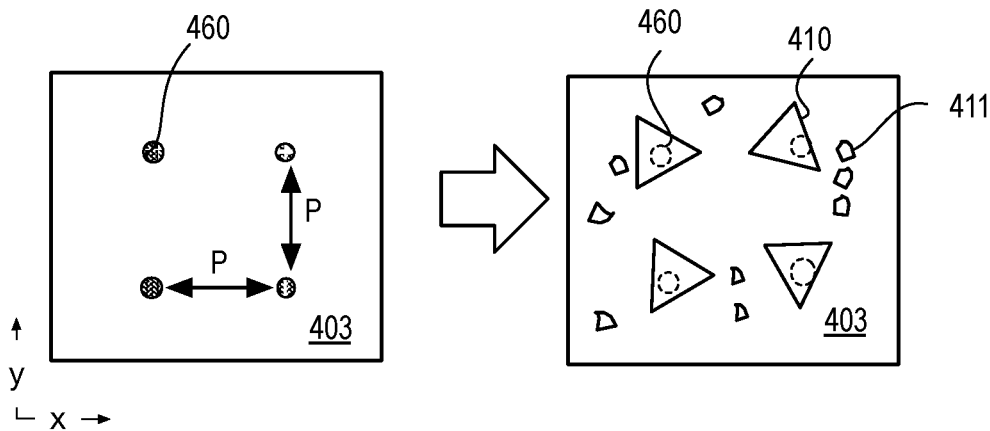
FIGS. 4A, 4B and 4C are plan views of single-crystalline metal chalcogenide growths nucleated preferentially at template regions, in accordance with some embodiments.

Methods 201 continue at block 220 where a nanometer patterning process is performed to define template regions having nanometer lateral dimensions (e.g., <50 nm on a side). A DUV, immersion, or EUV lithography process may define a mask over the metal precursor film and the metal precursor film may be etched according to the mask to yield template regions. FIG. 4A is a plan view of a substrate material 403 with a plurality of template regions 460 following the patterning process. Substrate material 403 is advantageously amorphous, and in some examples is a dielectric material comprising at least silicon and oxygen. Template regions 460 have a pattern pitch P, which may vary with implementation, but is advantageously nearly the same as the transistor pitch (or pitch of one or more terminals of the transistor). Although only one pitch P is illustrated, with template regions 460 thus being on a square grid, pitch P may vary between x and y dimensions. In exemplary embodiments, template regions 460 have a minimum pitch that is less than 50 nm, advantageously less than 20 nm, and may be 10 nm, or less. In exemplary embodiments, each template region has a largest lateral dimension less than 20 nm.

Methods 201 (FIG. 2A) may continue with a second iteration through blocks 210 and 220 if additional template regions of a second metal precursor are desired. For example, a second iteration of blocks 210 and 220 may be practiced in accordance with some embodiments to define separate p-type and n-type template regions. First template regions may comprise a first metal oxide that includes a metal (M1) suitable as an n-type (p-type) metal chalcogenide while second template regions may comprise a second metal oxide that includes a metal M2 suitable as a p-type (n-type) metal chalcogenide.

Following one or more iterations of blocks 210, 220, methods 201 continue at block 230 where a CVD process is performed with a chalcogen precursor. For example, $WO_x$ or $MoO_x$ deposited at block 210 may undergo chalcogenation reactions with one or more chalcogen precursor introduced at block 230, for example to generate $WS_x$ or $WSe_x$, $WTe_x$ or $MoS_x$, $MoSe_x$ or $MoTe_x$. In some embodiments, both sulfur and selenium may be introduced at block 230 to grow a semiconducting metal chalcogenide (e.g., $M_1S_xSe_{1-x}$, $M_1M_2S_ySe_{1-x}$, etc.). Chalcogenation at block 230 may occur during the CVD process, in part, because the metal oxide (or other metal precursor) may decompose at relatively low temperatures (e.g., 250° C.-350° C.) while the metal chalcogenide is more stable and able to survive much high temperatures (e.g., 500° C.-800° C.).

One salient feature of the consumption of a patterned precursor metal in accordance with methods 201 is that the metal chalcogenide material grown may have a thickness of only 2-3 monolayers as limited by the supply of precursor metal and/or duration of the CVD growth process. This thickness regime may be significantly below a thickness control threshold associated with deposition processes suitable for directly depositing a continuous metal chalcogenide thin film. Hence, whereas metal chalcogenide thicknesses may be practically limited by the deposition process to material thicknesses over 10 nm, methods 201 may yield metal chalcogenide grains with thicknesses ranging from 0.3 nm to 10 nm. This lower thickness regime may translate into superior control of a transistor channel as a function of an applied gate electrode voltage because the transistor channel is substantially two dimensional (2D).

For embodiments where two successive iterations of blocks 210 and 220 are practiced, block 230 may concurrently form two semiconducting metal chalcogenide materials in separate predetermined regions of a substrate. For example, a first of the metal chalcogenides may include the metal M1 (or alloy thereof) from first template regions while a second of the metal chalcogenides may include the metal M2 (or alloy thereof) from second template regions. Accordingly, complementary transistor logic may be implemented with one CVD growth process at block 230.

As further illustrated in the plan view of FIG. 4A, grain growth occurs preferentially at template regions 460, for example resulting in triangular metal chalcogenide grains 410. As a result of earlier nucleation, metal chalcogenide grains 410 preferentially grown are significantly larger than any satellite grains 411 which may have grown spontaneously over substrate material 403. Grains 410 may, have a side length of 5-10 nm, and an area of 10-20 nm$^2$, for example. In this example, metal chalcogenide grains 410 have not been allowed to grow long enough to intersect and form a grain boundary, but they may instead be allowed to do so. As described further below, although each of metal chalcogenide grains 410 is advantageously monocrystalline, the orientation of each crystal grain may vary randomly across the plurality of grains 410.

Figure 2B:
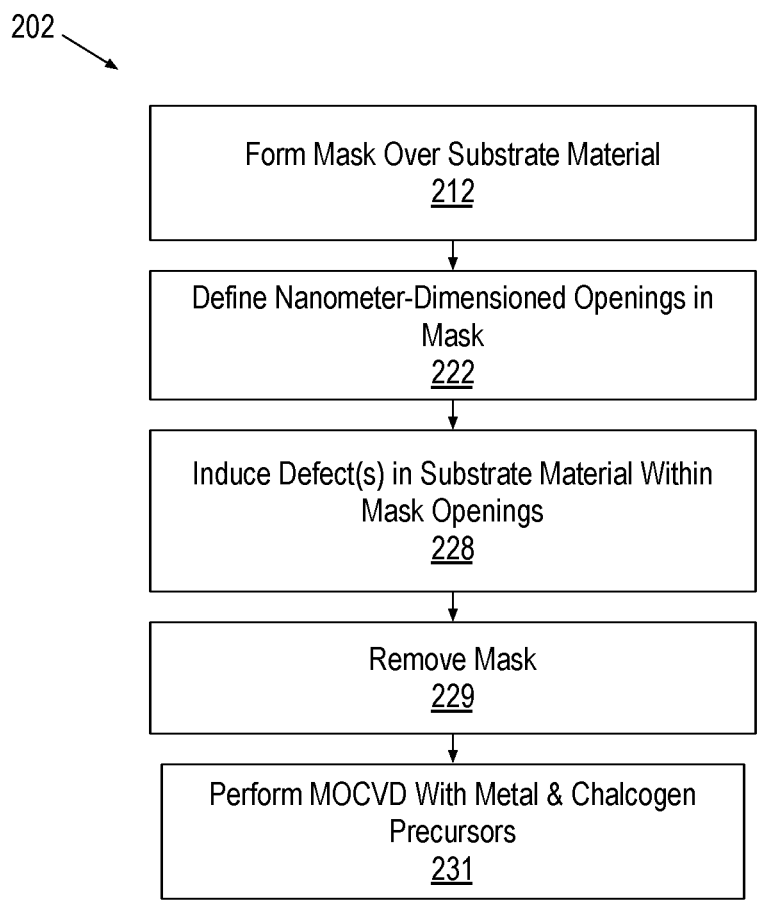
FIG. 2B is a flow diagram illustrating methods of fabricating transistor structures including a metal chalcogenide channel region formed through preferential growth at nanometer-dimensioned defected regions, in accordance with some embodiments of the methods introduced in FIG. 1.

FIG. 2B is a flow diagram illustrating methods 202 for fabricating transistor structures including a metal chalcogenide channel region formed by preferential growth from nanometer-dimensioned defected regions, in accordance with some embodiments of the methods 101. Methods 202 begin at block 212 where a mask is formed over substrate material. The mask may include any photoresist suitable for nanometer lithography. At block 222, openings are defined in the mask material to expose regions of the substrate material. The openings may be lithographically defined with a mask that is aligned to underlying substrate structures. The openings advantageously have a largest lateral dimension less than 20 nm, and advantageously less than 10 nm.

At block 228 one or more defects are induced in the substrate material within the mask openings. In some embodiments, the substrate material (e.g., a dielectric) is exposed to a flux of energetic ions (e.g., from a plasma source or ion beam). The ion flux is to induce damage (e.g., plasma damage) in a thickness of the exposed substrate material. Ions in the flux may be implanted into the substrate material and/or may sputter species of the exposed substrate material. The defects physically disrupt the substrate material surface. Within the nanometer-dimensioned windows, defected regions may have a threshold minimum dimension that may vary from a point defect (i.e., a single displaced atom) to hundreds, or even thousands, of displaced atoms. The defected regions induced at block 228 may be visible with transmission electron microscopy (TEM) imagery, for example.

At block 229, the mask is removed by any suitable technique. Methods 202 then complete at block 231 where the metal chalcogenide is grown, for example with a (MO) CVD process that includes the chalcogen precursor as well as a metal precursor since the template regions do not include metal precursor. Any of the metal chalcogenides described above may be formed at block 231. For example, a W precursor (e.g., pentakis(dimethylamido)tantalum, or PDMAT) may be introduced along with any of the chalcogen gases (e.g., H$_2$S) described above to grow WS$_x$ or WSe$_x$, WTe$_x$ preferentially from the defect regions formed at block 228. As another example, a Mo precursor (e.g., Bis(t-butylimido)bis(dimethylamino)molybdenum) may be introduced with any of the chalcogen gases (e.g., H$_2$S) described above to grow MoS$_x$, MoSe$_x$ or MoTe$_x$ preferentially from the defect regions formed at block 228. FIG. 4 is also illustrative of template regions 460 that comprise defected regions. The metal chalcogenide grains 410 illustrated in FIG. 4 are therefore also representative of preferential growths that rely on patterned defected regions.

Figure 2C:
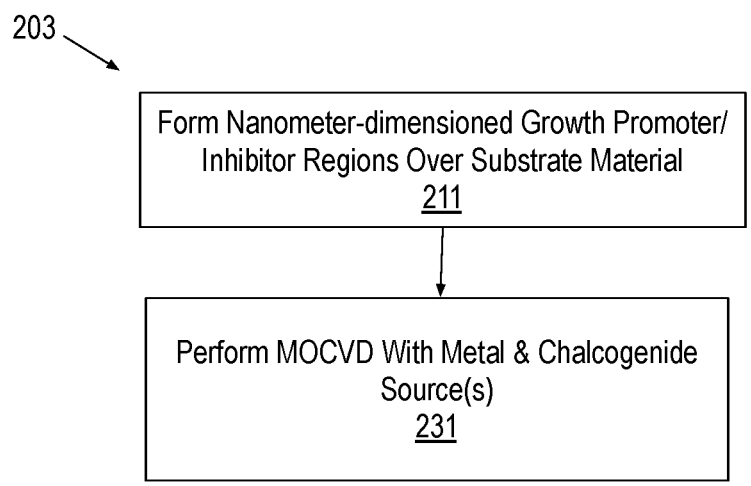
FIG. 2C is a flow diagram illustrating methods of fabricating transistor structures including a metal chalcogenide channel region formed by preferential growths from nanometer-dimensioned regions of growth promoter or inhibitor, in accordance with some embodiments of the methods introduced in FIG. 1.
Figure 4B:
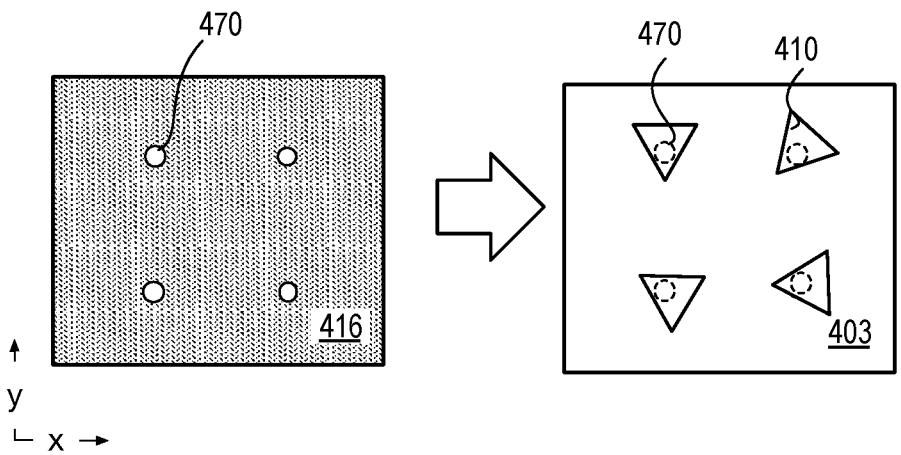

FIG. 2C is a flow diagram illustrating methods 203 for fabricating transistor structures including a metal chalcogenide channel region formed by preferential growth from nanometer-dimensioned regions of growth promoter or inhibitor, in accordance with some embodiments of the methods 101. Methods 203 begin at block 211 where regions of growth promoter or growth inhibitor are formed over the substrate material. The regions of promoter/inhibitor are again to have nanometer lateral dimensions, and may be deposited with an area selective process (e.g., through self-assembly). Area selective deposition may form nanometer dimensioned template regions based on heterogeneous surfaces resulting from prior patterning of substrate structures. Alternatively, at block 211 the substrate may be masked, regions (e.g., openings or pillars) patterned in the mask, the promoter/inhibitor applied, and the mask removed selectively to the promoter/inhibitor. FIG. 4B illustrates a plan view where an inhibitor 416 has been applied. Within template regions 470 the substrate surface is uninhibited.

In exemplary embodiments, the growth promoter comprises at least one of an alkali metal halide, sodium cholate, or perylene-3,4,9,10-tetracarboxylic acid tetrapotassium salt (PTAS). Other promoters are also known to be suitable for one or more of the metal chalcongenides described above. While growth promoters increase growth rates, inhibitors will decrease growth rates. In exemplary embodiments, at least one of the growth inhibitors comprises an alkyl or fluorinated chain molecule with a head group that attaches preferentially to a surface of the substrate. Growth promoters and inhibitors may be applied in vapor or liquid phase. Growth inhibitor films and/or growth promoter films may form self-assembled monolayers (SAMs) that are self-limiting and provide high film uniformity and/or surface termination homogeneity.

Methods 201 are then again completed at block 231 where the metal chalcogenide is grown, for example with a MOCVD process that includes the chalcogen precursor as well as a metal precursor. Any of the metal chalcogenides described above may be formed at block 231. For embodiments where a template region comprises a patterned inhibitor, for example as shown in FIG. 4B, metal chalcogenide grains 410 may be preferentially located at predetermined locations over the substrate material 403. Embodiments with template regions comprising a patterned promoter similarly confine spontaneous metal chalcogenide grain nucleation to predetermined locations.

Figure 3A:
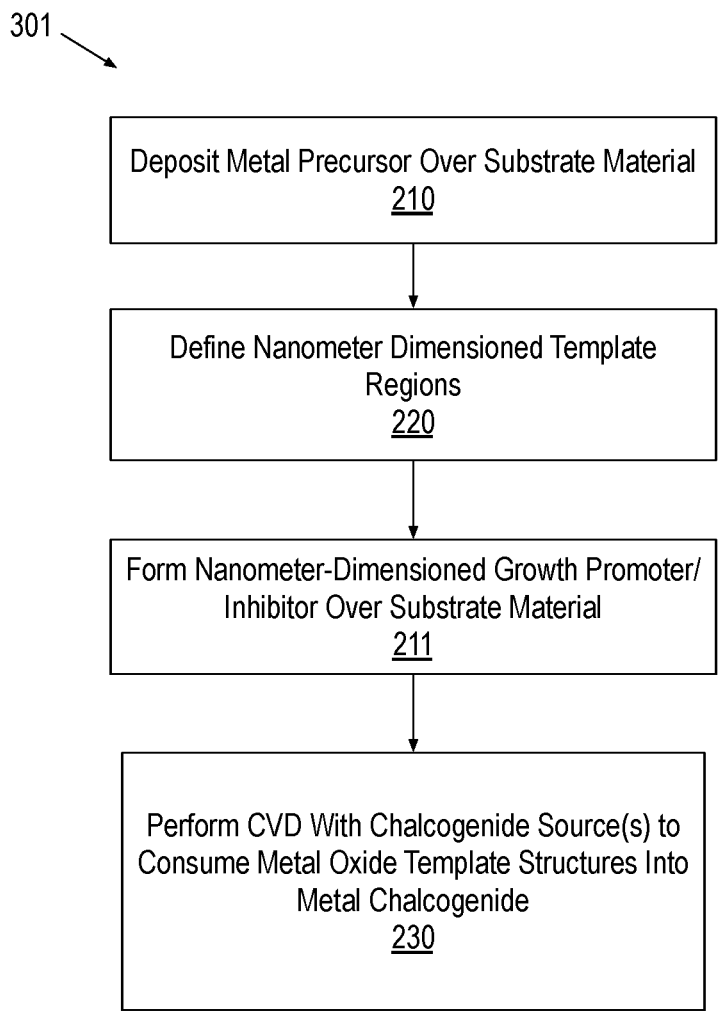
FIG. 3A is a flow diagram illustrating methods of fabricating transistor structures including a metal chalcogenide channel region formed through chalcogenation of a nanometer-dimensioned metal precursor as supplemented by nanometer-dimensioned regions of growth promoter or inhibitor, in accordance with some embodiments.

As previously noted, the techniques described above are not mutually exclusive and can be combined. FIG. 3A is a flow diagram illustrating methods 301 for fabricating transistor structures including a metal chalcogenide channel region formed through chalcogenation of a nanometer-dimensioned metal precursor as supplemented by nanometer-dimensioned regions of growth promoter or inhibitor, in accordance with some embodiments.

Figure 4C:
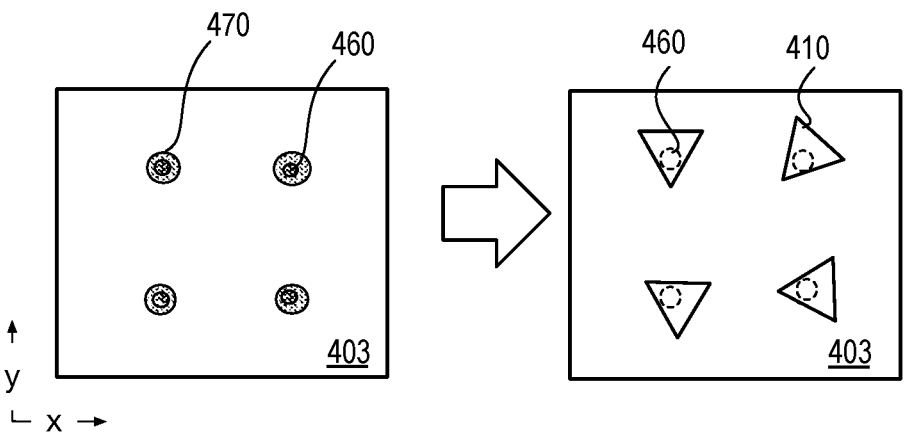

Methods 301 again include block 210, and any of the techniques described above for block 210 may be practiced to form a metal precursor, such any of the metal oxides described above. Nanometer dimensioned features of the metal precursor material are then defined at block 220, for example with a subtractive etch of the metal precursor material according to a mask pattern that is aligned to one or more substrate structures. Methods 301 continue at block 211 where nanometer-dimensioned growth promoter/inhibitor regions are formed over the substrate surface, for example with a SAM process that is dependent on a heterogeneous substrate surface resulting from prior patterning of either substrate structures or resulting from the metal precursor patterning. FIG. 4C is a plan view of a substrate surface with patterned template regions 460 (e.g., comprising metal oxide). A SAM promoter may then be preferentially formed within template regions 470 surrounding template regions 460, for example as a result the difference in the chemical composition of template regions 460 (e.g., metal oxide) and substrate material 403 (e.g., silicon dioxide). Alternatively, a second lithography-based patterning of a promoter may form template regions 470 substantially aligned to template regions 460. The two template regions 460 and 470 may then combine as template regions that are a summation of two lithography-based patterning operations.

Although the polarity illustrated in FIG. 4C is illustrative of template regions comprising a promoter, template regions lacking an inhibitor may be similarly formed, but with opposite polarity. For example, the inhibitor 416 illustrated in FIG. 4B may be formed to surround uninhibited regions within which template regions 460 (FIG. 4C) reside. In some embodiments, a SAM inhibitor may attach to substrate material 403 preferentially to template regions 460 comprising a metal precursor. For such embodiments, not only are growth precursor locations defined, but inhibitor over the substrate surface wherever the precursor is absent may further reduce the spontaneity of metal chalcogenide nucleation.

Methods 301 again complete at block 230 where a CVD process comprising a chalcogen precursor consumes some (or all) of the metal precursor at the template regions, for example to arrive at the plurality of metal chalcogenide grains 410 further depicted in FIG. 4C.

Figure 3B:
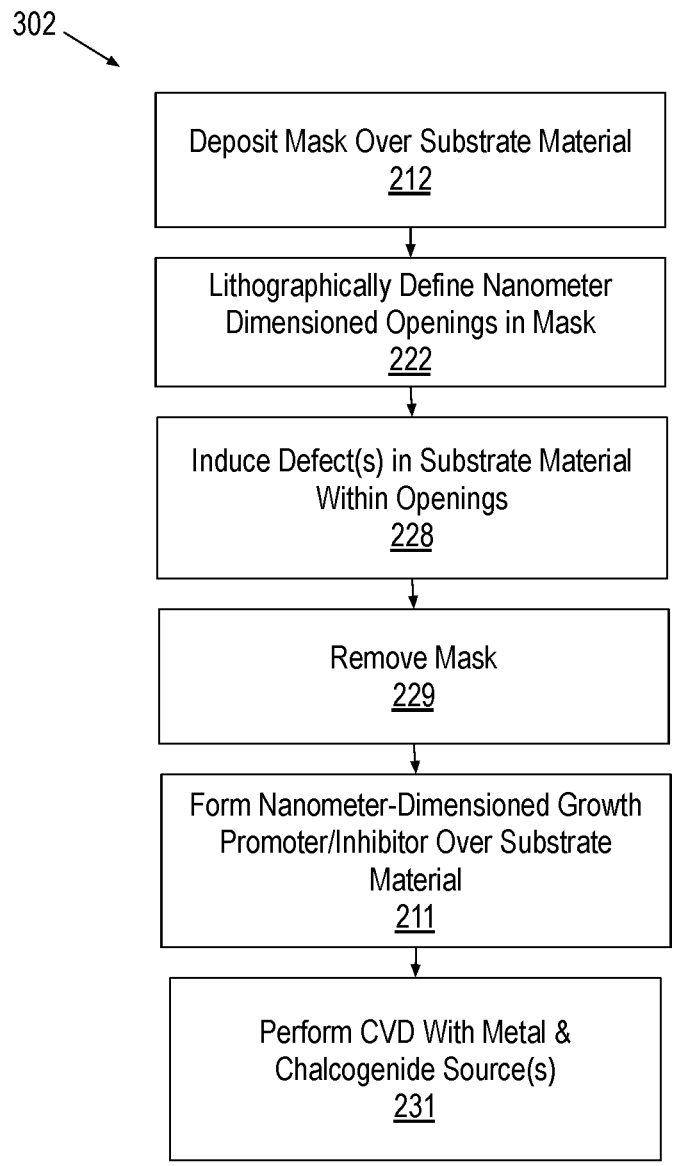
FIG. 3B is a flow diagram illustrating methods of fabricating transistor structures including a metal chalcogenide channel region formed by preferential growths from nanometer-dimensioned defected regions as supplemented by nanometer-dimensioned regions of growth promoter or inhibitor, in accordance with some embodiments.

Defected template regions may also be combined with regions of growth promoter and/or inhibitor. FIG. 3B is a flow diagram illustrating methods 302 for fabricating transistor structures including a metal chalcogenide channel region formed by preferential growths from nanometer-dimensioned defected regions as supplemented by nanometer-dimensioned regions of growth promoter or inhibitor. Methods 302 include all the blocks from methods 202 (FIG. 2B), but with the additional formation of patterned growth promoter and/or inhibitor prior to the MOCVD growth of the metal chalcogenide. Methods 302 may therefore generate structures substantially the same as those illustrated in FIG. 4C, where template regions 460 are defected regions rather than metal precursor.

In exemplary embodiments, transistor structures occupy at least some portion of the template region, thereby ensuring that a channel of the transistor will be located within a grain of metal chalcogenide that was preferentially grown. FIG. 5A-5E illustrate both a top-down plan view and a cross sectional view of a bottom-gate transistor structure 501 evolving to include a monocrystalline metal chalcogenide channel material as the methods 101 are practiced, in accordance with some embodiments. FIG. 6A-6E illustrate both a top-down plan view and a cross sectional view of a top-gate transistor structure 601 evolving to include a monocrystalline metal chalcogenide channel material as the methods 101 are practiced, in accordance with some embodiments. Although bottom gate and top gate structures are illustrated, various aspects of these representative transistor structures are also applicable to other transistor architectures (e.g., fin, nanowire or nanoribbon).

Figure 5A:
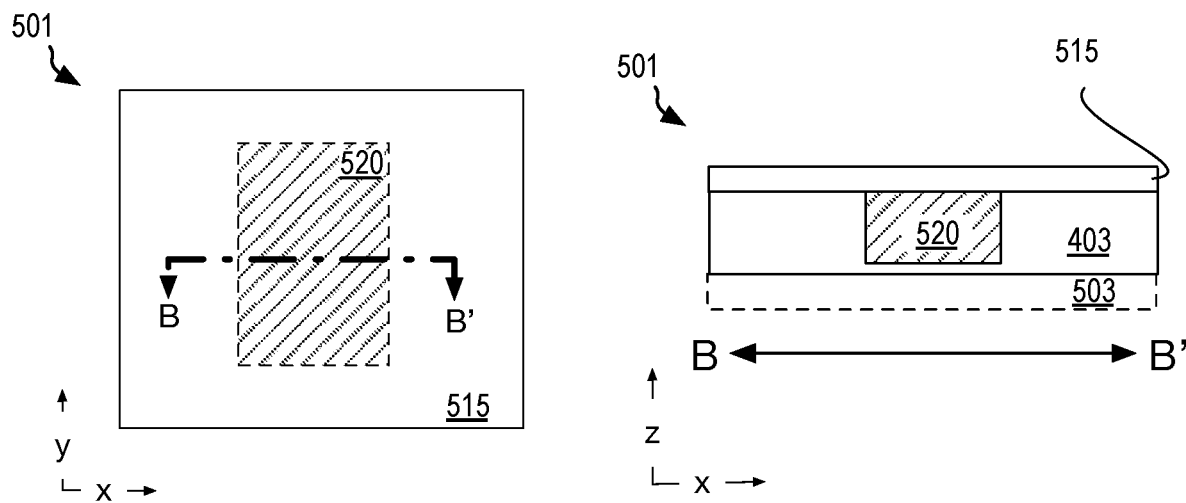
FIGS. 5A, 5B, 5C, 5D and 5E are top-down plan and cross sectional views of bottom-gate transistor structure evolving to include a monocrystalline metal chalcogenide channel material as the methods introduced in FIG. 1 are practiced, in accordance with some embodiments.

Referring first to FIG. 5A, transistor structure 501 is to become a FET with a source terminal, a drain terminal, and a gate terminal. These terminals are to be electrically coupled through a semiconducting metal chalcogenide, for example having one or more of the attributes described above in the context of methods 101. Transistor structure 501 may be a planar FET, or a non-planar FET. Non-planar examples include a FinFET, nanowire FET, or nanoribbon FET. Transistor structure 501 may be arrayed over an area of a device layer within an IC, for example.

Because a metal chalcogenide is not yet present, the transistor structure 501, as illustrated in FIG. 5A, comprises only substrate structures. These substrate structures include a bottom gate electrode 520, which may include an elemental metal layer, a metal alloy layer, or both. In some embodiments the gate electrode is a metal nitride, such as TiN. The gate electrode may also comprise Al (e.g., TiAlN). Other alloy constituents may also be employed in gate electrode 520, such as, but not limited to C, Ta, W, Pt, Cu, Co, and Sn.

As further illustrated in the cross-sectional view (taken along the B-B' line shown in the plan view), gate electrode 520 is over substrate 503, and a gate dielectric 515 is over gate electrode 520. Gate electrode 520 is embedded within substrate material 403, which may be any suitable dielectric material such as, but not limited to, silicon dioxide, silicon nitride, silicon oxynitride, or a low-k material having a relative permittivity below 3.5, for example. Substrate 503 is illustrated in dashed line to emphasize that substrate 503 may further include any number of underlying material and/or circuitry levels.

Together, gate electrode 520 and gate dielectric 515 may be referred to as a gate stack. While any gate stack materials known to be suitable for a metal chalcogenide channel may be utilized, in some exemplary embodiments the gate stack includes a high-k dielectric material (with a bulk relative permittivity greater than 9). Exemplary high-k materials include metal oxides, such as, but not limited to AlOx (comprising predominantly Al and O), $HfO_x$ (comprising predominantly Hf and O), $HfAlO_x$ (comprising predominantly Al, Hf, and O). These exemplary metal oxides may form a stable interface to a metal chalcogenide channel material. Silicates, such as, but not limited to $HfSiO_x$, or $TaSiO_x$ may also be suitable. Although structure 501 is a MOSFET architecture, a bottom gate may be similarly employed in a MESFET structure where gate dielectric 515 is absent.

Figure 6A:
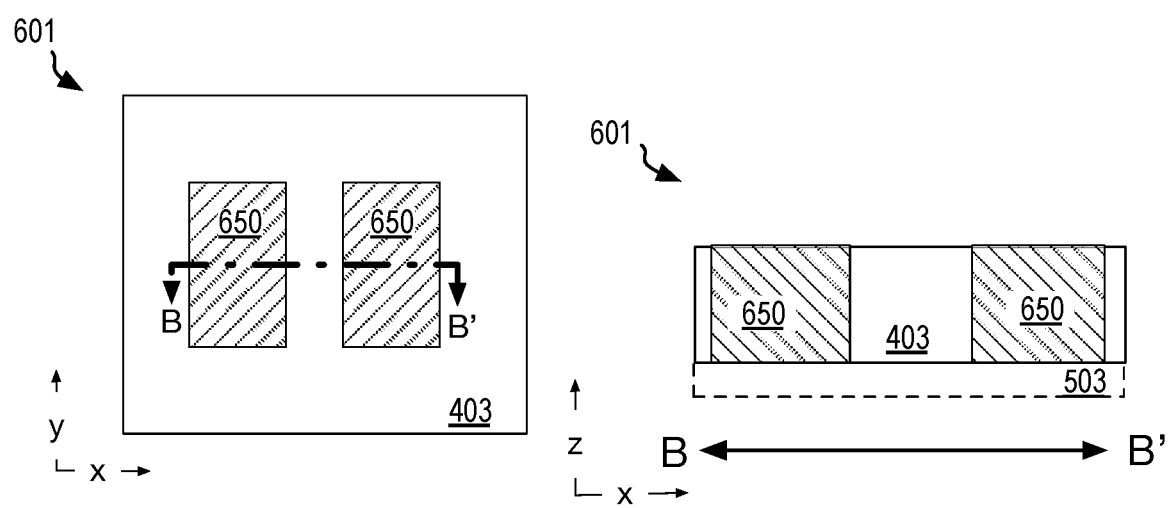
FIGS. 6A, 6B, 6C, 6D and 6E are top-down plan and cross sectional views of a top-gate transistor structure evolving to include a monocrystalline metal chalcogenide channel material as the methods introduced in FIG. 1 are practiced, in accordance with some embodiments.

FIG. 6A similarly illustrates substrate features that will be incorporated into a MOSFET structure 601. Transistor structure 601 may be arrayed over an area of a device layer within IC die, for example. The transistor structure 601, as illustrated in FIG. 6A, comprises only substrate structures because a metal chalcogenide channel region has not yet been formed. For this embodiment, substrate structures include bottom source and drain terminals 650. As illustrated in the cross-sectional view, source and drain terminals 650 are embedded within substrate material 403.

Source/drain terminals 650 may include one or more metals that will form an ohmic or tunneling junction directly to a semiconducting metal chalcogenide channel material, or to an intervening source/drain semiconductor material. Source/drain terminals 650 may comprise any metal with some examples being Ti, W, Pt, their alloys, and nitrides. In the top-gate architecture illustrated in FIG. 6A, transistor channel length is dependent on the spacing of source/drain contact terminals (metallization) 650, which may be defined by some minimum lithographic feature resolution (e.g., 10-20 nm pitch). As noted above, metal chalcogenides, particularly those formed according to methods 101, may have thicknesses of only a few monolayers. Channel thickness T may therefore be as little as 0.5-10 nm. In some exemplary embodiments therefore, channel length L is larger than channel thickness T.

Figure 5B:
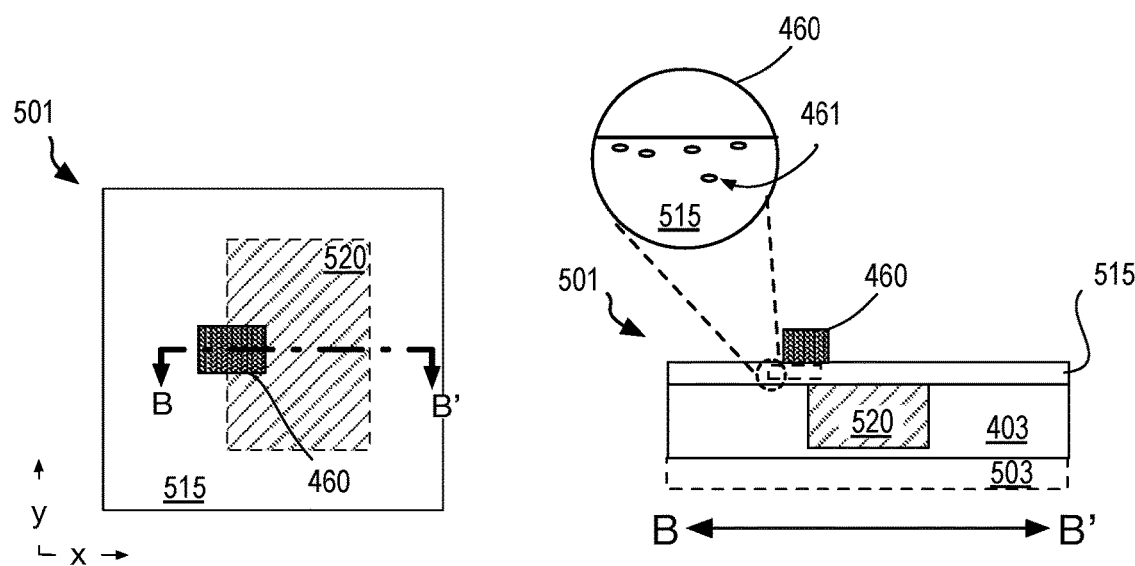
Figure 6B:
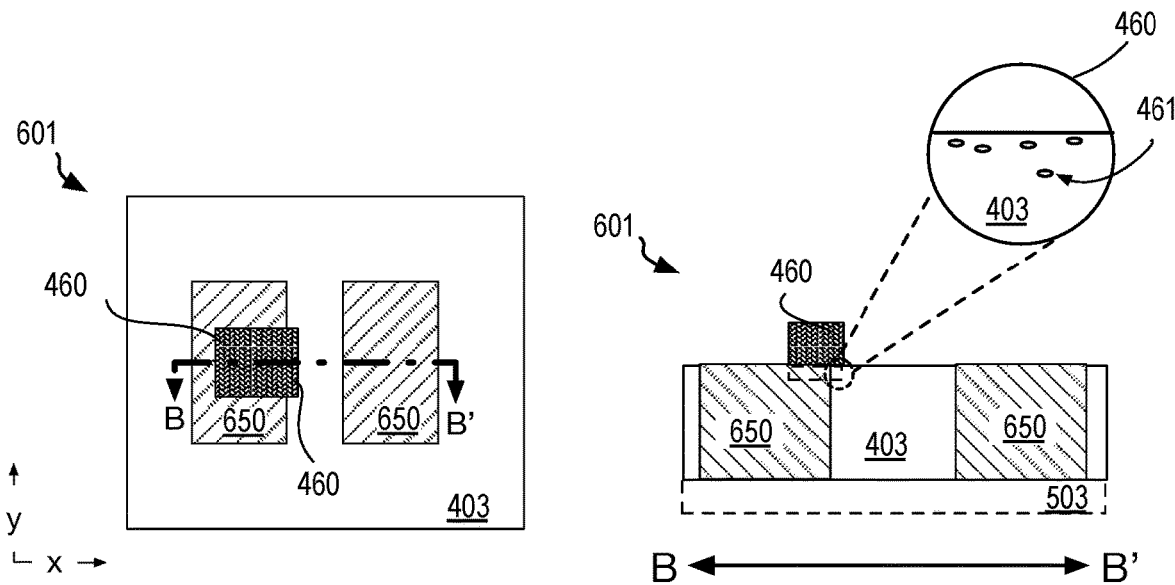

FIG. 5B and 6B further illustrate transistor structures 501, 601 after evolving to include template region 460. Template region 460 is over the substrate structures and, for example, is aligned to either bottom gate electrode 520 or bottom source drain terminals 650. In FIGS. 5B and 6B, template region 460 is either a metal precursor (e.g., metal oxide) having some non-zero thickness over the substrate structures, or is a defected region within a surface of the substrate structures. In FIG. 5B, for example, template region 460 may comprise a metal precursor in contact with a top surface of gate dielectric 515, or may comprise defects 461 within gate dielectric 515. In FIG. 6B, template region 460 may comprise defects 461 within substrate material 403 and/or source/drain terminal 650. Alternatively, template region 460 may comprise a metal precursor in contact with a top surface of source/drain terminal 650 and/or substrate material 403.

Figure 5C:
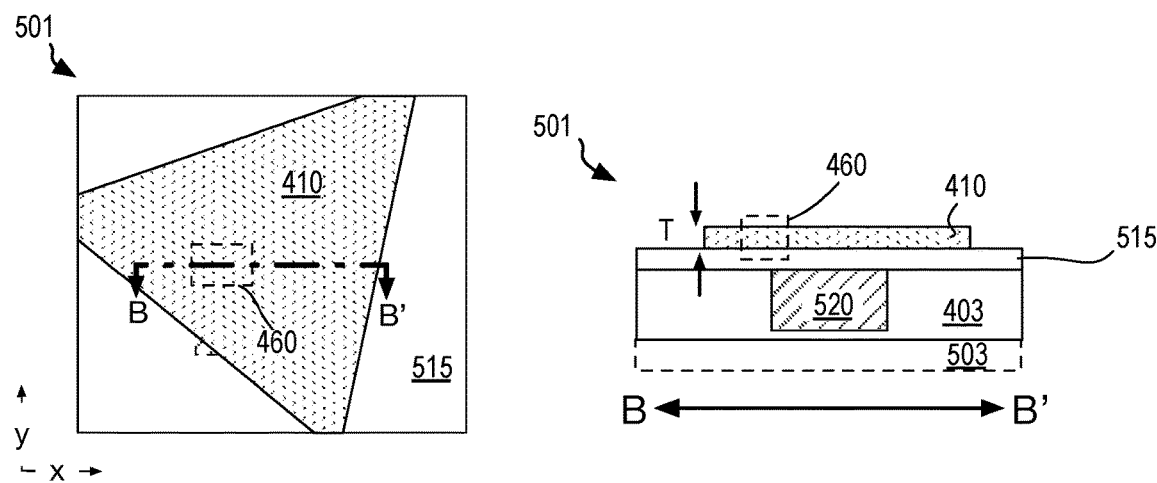
Figure 6C:
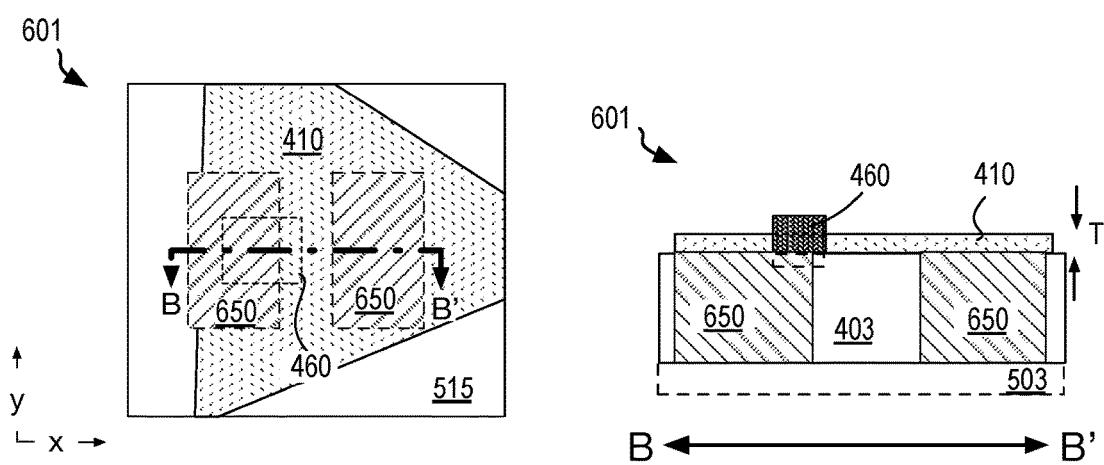

FIGS. 5C and 6C further illustrate transistor structures 501, 601 after evolving to include a metal chalcogenide grain 410. In the example illustrated in FIG. 5C, any portion of template region 460 that previously existed over gate dielectric 515 is illustrated in dashed line as having been completely consumed through chalcogenation to form grain 410. Defected regions within gate dielectric 515 may remain, or may have been annealed out during metal chalcogenide growth. In the example illustrated in FIG. 6C, some remnant, or residue, of template region 460 remains over source/drain terminal 650 and/or substrate material (e.g., dielectric) 403. This remainder of template region 460 may therefore be retained as a permanent feature within transistor structure 601, or subsequently stripped off selectively. In FIGS. 5C and 6C, metal chalcogenide grain 410 has a thickness T that is less than 20 nm, and advantageously less than 10 nm.

Figure 5D:
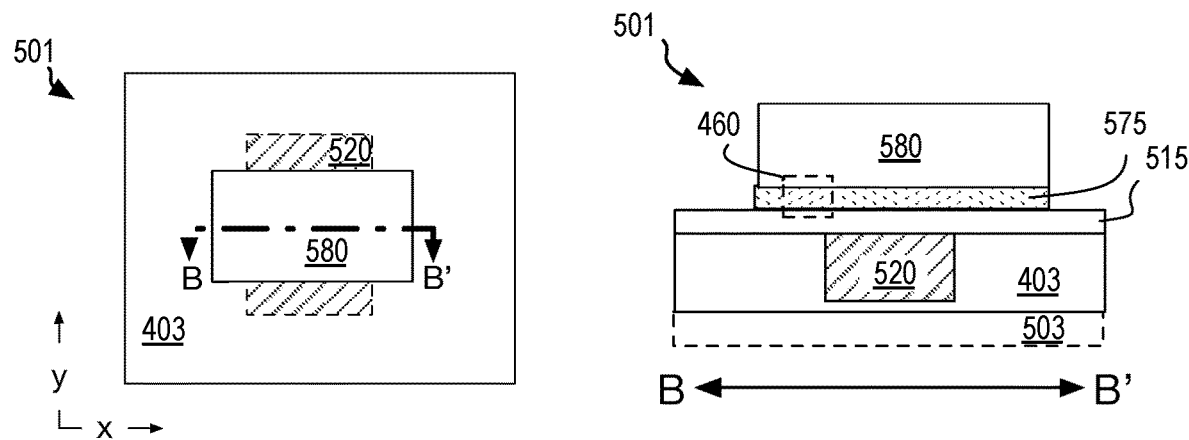
Figure 6D:
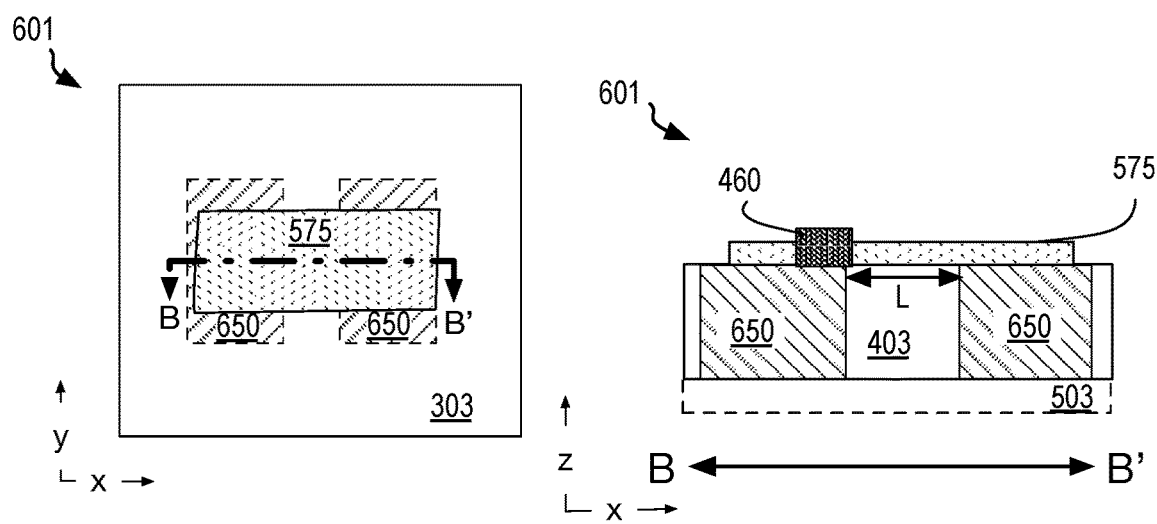

FIGS. 5D and 6D further illustrate transistor structures 501, 601 after a metal chalcogenide channel region 575 has been subtractively patterned from a metal chalcogenide grain 410. As shown in FIG. 5D, a hardmask material (e.g., dielectric) 580 may be patterned concurrently with the metal chalcogenide, or the metal chalcogenide may be patterned without a hardmask, as shown in FIG. 6D. The channel region 575 may be advantageously aligned to a substrate structure, such as bottom gate electrode 520 (FIG. 5D), or bottom source/drain terminals 650 (FIG. 6D). As long as the area of a metal chalcogenide grain was sufficient, each channel region 575 can be of a predetermined area (e.g., 10-20 nm$^2$) and substantially free of any grain boundaries (i.e., monocrystalline).

Figure 5E:
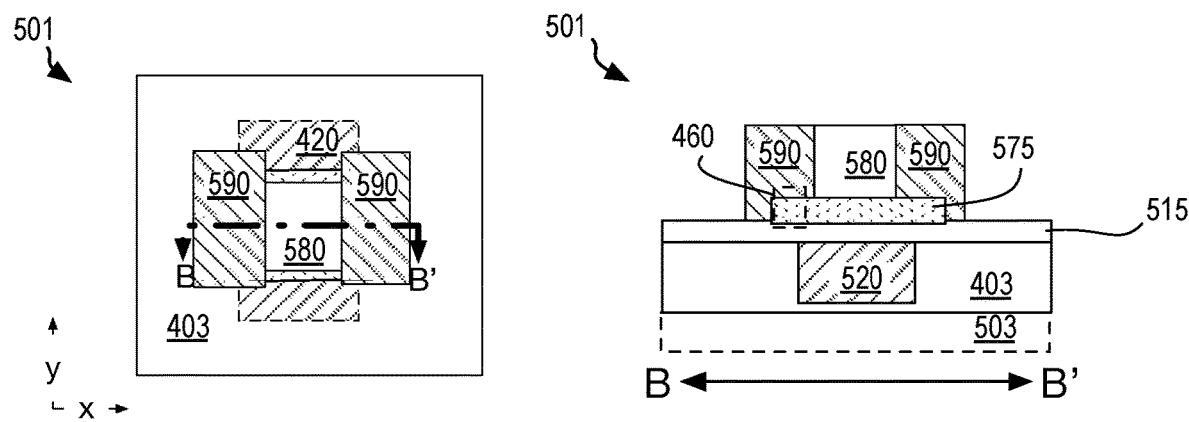
Figure 6E:
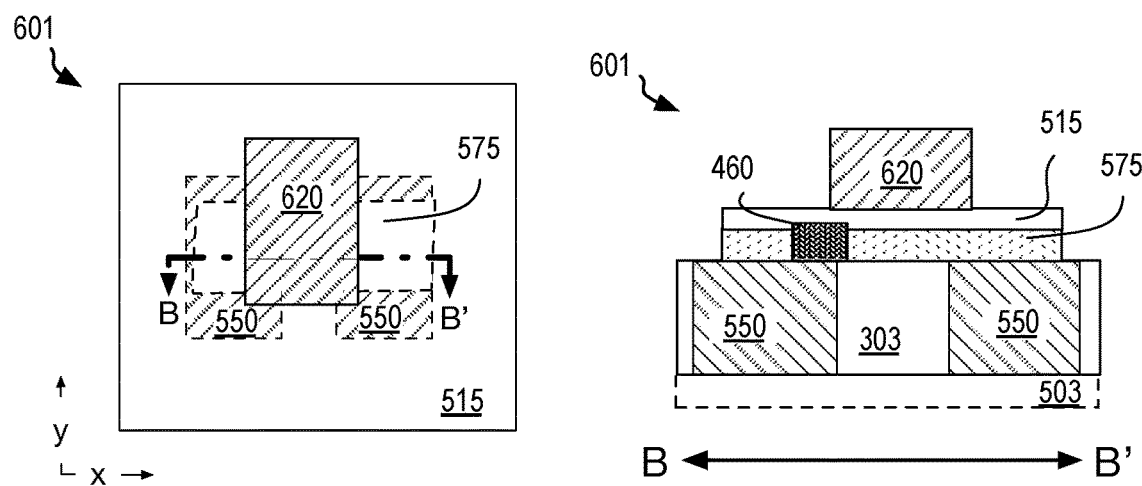

FIG. 5E further illustrates transistor structure 501 evolving to include top source and drain terminals 590. FIG. 6E similarly illustrates transistor structure 601 evolving to include a top gate electrode 620. Source and drain terminals 590 may comprise any suitable metal, for example any of those described above for source and drain terminals 650. Likewise, gate electrode 620 may comprise any suitable metal, for example any of those described above for gate electrode 520. In the top gate transistor structure 601, gate electrode 620 is again separated from channel region 575 by gate dielectric 515.

Figure 7:
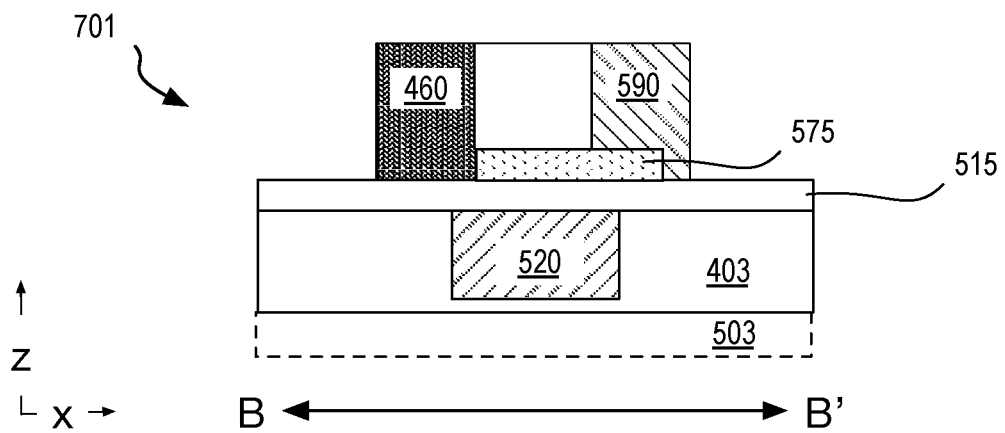
FIG. 7 and FIG. 8 are cross-sectional views of transistor structures in which a template region couples a source or drain terminal to the channel region, in accordance with some embodiments.
Figure 8:
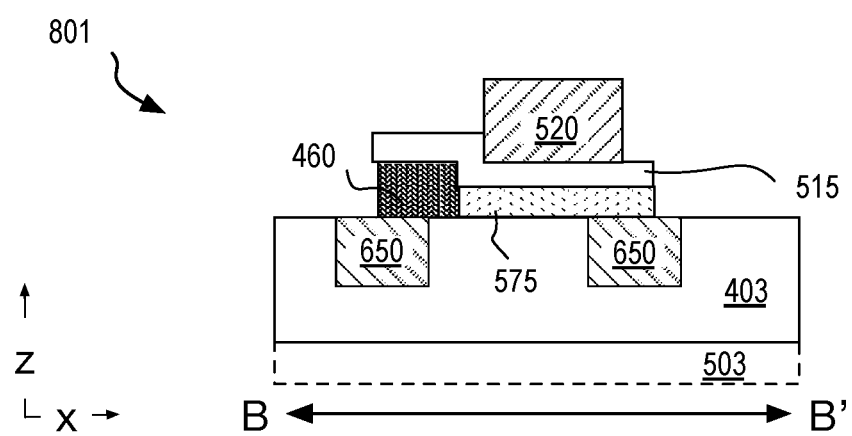

As noted above, template regions 460 may remain as a permanent structural feature of the transistors. As shown in FIG. 7, template region 460 further serves as a source/drain terminal of transistor structure 701. Such an asymmetrical source/drain terminal architecture, as well as the composition of template region 460 is indicative of channel region 575 having been preferentially grown from template region 460. In the example shown in FIG. 8, top gate transistor structure 801 also has terminal asymmetry, but template region 460 instead electrically couples one of the two source/drain terminals 650 to channel region 575. Such embodiments may be feasible where the electrical resistance of template region 460 is sufficiently low (e.g., $WO_x$). If the composition of a residual template region would instead be detrimental to transistor operation, the residue may be removed with a selective strip/clean process.

Although individual transistor structures are depicted in FIG. 5A-FIG. 8, any number of such structures may be fabricated concurrently. Within a plurality of such transistor structures, individual ones of the plurality may include a channel region comprising a substantially monocrystalline metal chalcogenide. However, across the plurality there may be differences in the orientations of the metal chalcogenide crystals. In some embodiments, for example, the in-plane orientation of the metal chalcogenide crystals may vary randomly. For example, no more than two adjacent transistor structures may have the same crystal orientation. This characteristic may be result of discrete template regions, for example as described above in the context of methods 101 (FIG. 1).

Figure 9:
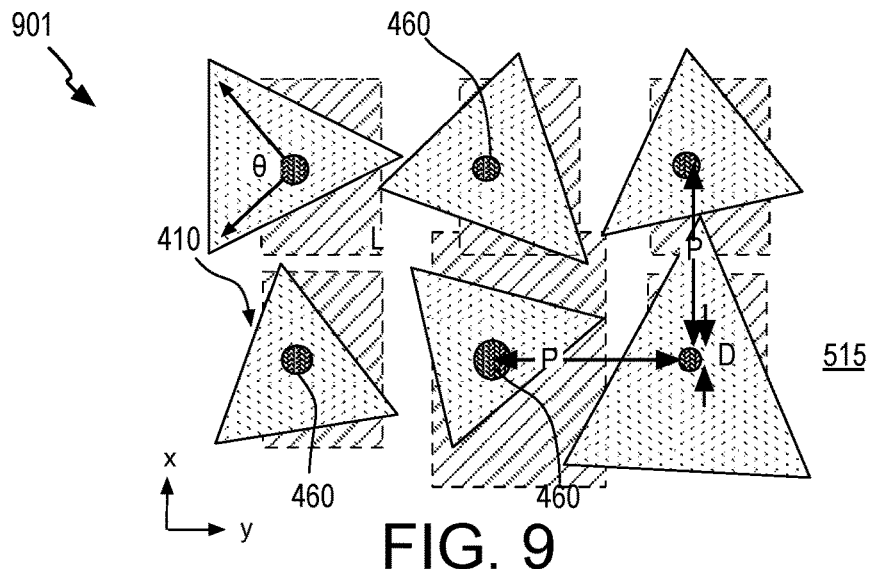
FIG. 9 is a top-down plan view of metal chalcogenide crystals.

FIG. 9 illustrates a plan view of a device level in an IC structure 901, in accordance with some embodiments. As shown in FIG. 9, each of the co-planar template regions 460 has a minimum lateral dimension (e.g., diameter) D. The minimum lateral dimension D may be defined by an etch process, or other technique employed to pattern template regions 460 so as to limit the number of metal chalcogenide grains that can spontaneously form from one template region 460. In some embodiments, D is less than 100 nm, and advantageously less than 30 nm (e.g., 10-20 nm) Minimum lateral dimension D is illustrated as being approximately the same in both x and y dimensions, which may advantageously minimize a number of grains grown from a single template region 460.

Each of metal chalcogenide grains 410 may have a crystal orientation defined by azimuthal angle θ (e.g., within the illustrated x-y plane). In the example illustrated in FIG. 9, metal chalcogenide semiconductor grain 410 has some lateral crystal length L from template region 460. Within the 2D array of template regions 460, the template regions 460 have a fixed lateral grid pitch P, which may be predetermined to form crystal grains at a transistor channel pitch.

Because template regions 460 lack any shared crystal reference, metal chalcogenide grains 410 may each have a different in-plane crystal orientation angle θ that is associated with a single nucleation.

Figure 10:
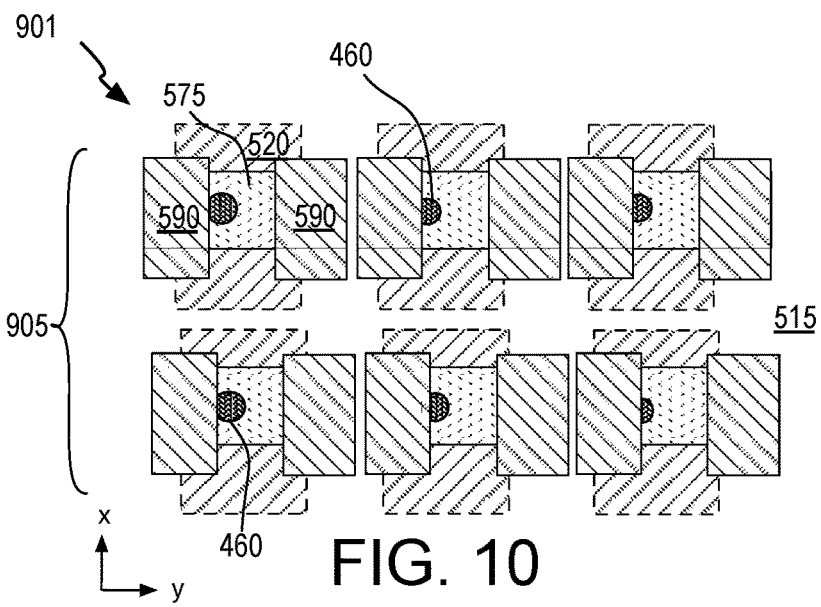
FIGS. 10 and 11 are top-down plan views of two-dimensional (2D) arrays of transistor structures, each including a template region, in accordance with some embodiments.

FIG. 10 further illustrates the patterning of a plurality of channel regions 575 within IC structure 901. As shown, a plurality of co-planar transistors 905 include metal chalcogenide semiconductor of a different crystal orientations. While not all channel regions 575 may have exactly the same crystallinity, each of transistors 905 may nevertheless display superior performance associated with a higher quality (more crystalline) semiconductor material. As further shown in FIG. 10, for example, each three terminal transistor structure includes a single template region 460 within its footprint.

Figure 11:
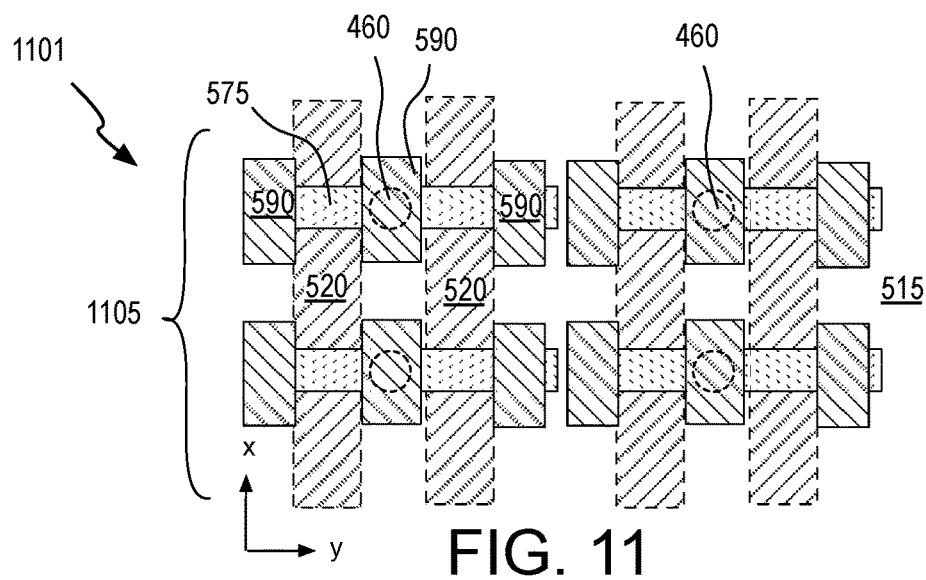

In other embodiments, two or three adjacent transistor structures may have a monocrystalline metal chalcogenide channel region with the same crystal orientation. For such embodiments, there may be only one template region that is shared by these adjacent transistor structures. FIG. 11 is a plan view of an IC structure 1101 including a plurality of co-planar active devices 1105 in which template region 460 is within an area of a single source/drain terminal 590 that is common to two adjacent transistor structures. Hence, the pitch of transistors that share one terminal in common is approximately twice that of template regions 460. For such architectures, channel regions 575 of adjacent pairs of transistors structures may be substantially the same (e.g., same in-plane crystal orientation). However, channel regions 575 separated by two independent source/drain terminals 590 have different crystallinity (e.g., in-plane orientation).

Figure 12:
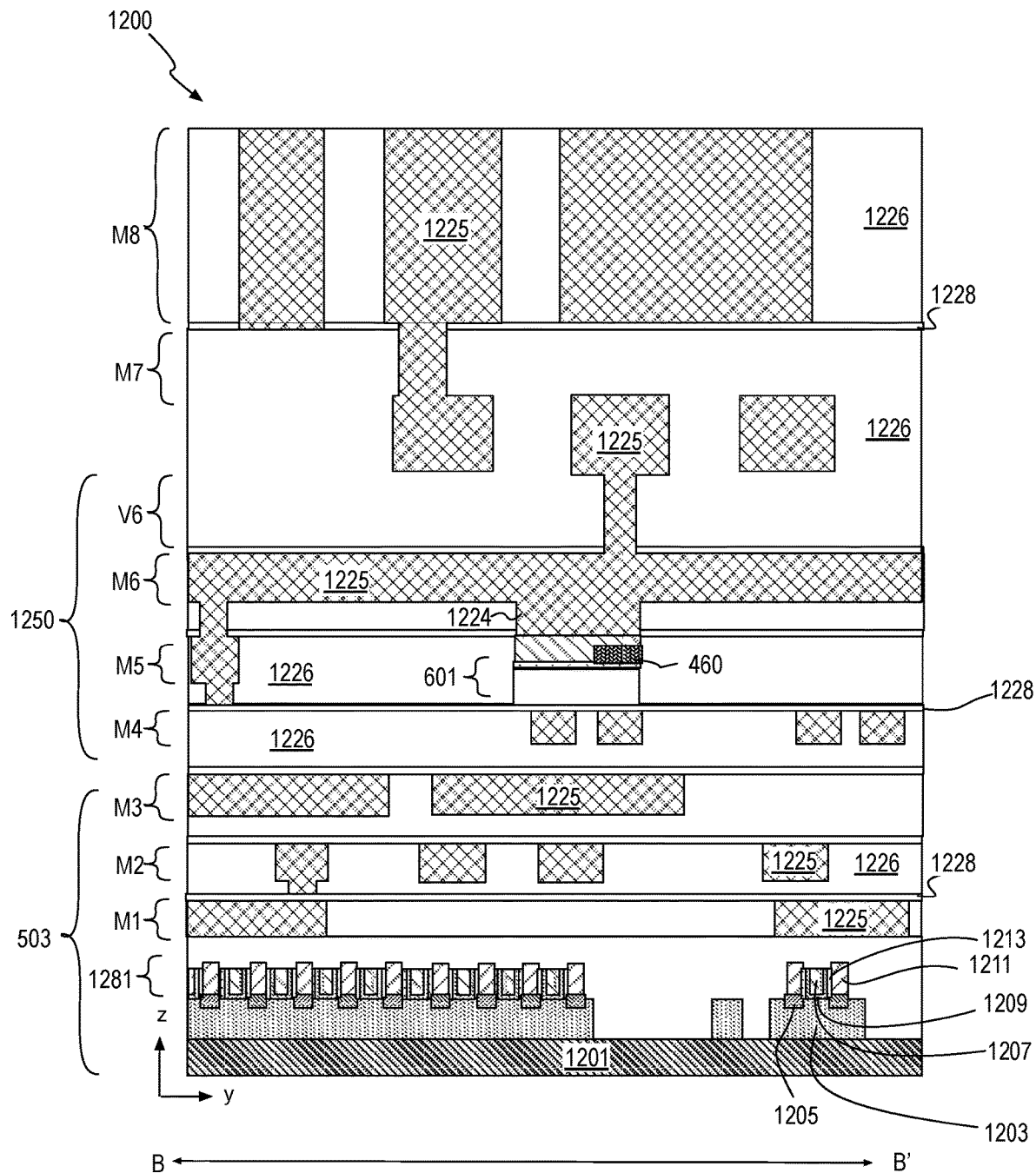
FIG. 12 illustrates a cross-sectional view of a 3DIC structure including metal chalcogenide transistor circuitry over CMOS FET circuitry, in accordance with some embodiments.

Although the transistor structures described herein may be the only transistor structures of an IC, in some embodiments the transistor structures describe herein are implemented in a 3DIC that includes a plurality of device levels. FIG. 12 illustrates a cross-sectional side view of a 3D IC structure 1200, in accordance with some embodiments.

Structure 1200 illustrates a portion of a monolithic IC that includes a substrate 503 that comprises FEOL device circuitry fabricated over and/or on a single crystalline substrate 1201. In this example, FEOL device circuitry includes a plurality of MOSFETs 1281 that employ a monocrystalline semiconductor material 1203 for at least a channel region of each transistor. In other embodiments, FEOL device circuitry includes other types of transistors (e.g., bipolar junction transistor, etc.), or other active devices employing one or more semiconductor materials (e.g., diodes, lasers, etc.). FETs 1281 include a gate terminal 1207 separated from a semiconductor material 1203 by a gate dielectric 1209. The channel region of semiconductor material 1203 separates semiconductor terminals 1205 (source semiconductor and drain semiconductor). Contact metallization 1211 is in contact with semiconductor terminals 1205 and is separated from gate terminal 1207 by an intervening dielectric spacer 1213. Any materials known to be suitable for FETs may be present in FEOL FETs 1281. FETs 1281 may be planar or non-planar devices. In some advantageous embodiments, FETS 1281 are finFETs or nanoribbon FETs. FETs 1281 may include one or more semiconductor materials. As one example, semiconductor material 1203 is a surface layer of a substantially monocrystalline substrate 1201. Substrate 1201 may be any material known to be suitable for the fabrication of MOSFET (CMOS) circuitry, such as, but not limited to, group IV materials (e.g., substantially pure silicon, substantially pure germanium, and SiGe alloys that may range from predominantly Si to predominantly Ge).

FEOL device circuitry may further include one or more levels of interconnect metallization 1225 electrically insulated by dielectric materials 1226, 1228. In the exemplary embodiment illustrated, FEOL device circuitry includes metal-one (M1), metal-two (M2) and metal-three (M3) interconnect metallization levels. Interconnect metallization 1225 may be any metal(s) suitable for FEOL and/or BEOL IC interconnection. Interconnect metallization 1225, may be, for example, an alloy of predominantly Cu, an alloy of predominantly W, or an alloy of predominantly Al, etc. Dielectric material 1226 may be any dielectric material known to be suitable for electrical isolation of monolithic ICs. In some embodiments, dielectric material 1226 comprises silicon, and at least one of oxygen and nitrogen. Dielectric material 1226 may be SiO, SiN, or SiON, for example. Dielectric material 1226 may also be a low-K dielectric material (e.g., having a dielectric constant below that of $SiO_2$). Dielectric material 1228 has a different composition that dielectric material 1226, and may, for example, be of a composition that has a higher dielectric constant than that of dielectric material 1226. In some examples where dielectric material 1226 is predominantly silicon and oxygen (i.e., $SiO_x$), dielectric material 1228 is predominantly silicon and nitrogen (i.e., $SiN_x$).

BEOL device circuitry is located over the FEOL device circuitry, with dielectric material 1226 therebetween. BEOL device circuitry includes a plurality of transistor structures 601 that include a metal chalcogenide channel region. Each transistor structure may further include any of the features described above, such as but not limited to, template region 460.

BEOL circuitry may comprise any number of metallization levels over transistor structures 601, such as a metallization level (e.g., M6) immediately above the metallization level (e.g., M5) in which transistor structures 601 reside. As further shown, a via 1224 electrically connects interconnect metallization levels to a gate electrode of transistor structures 601. Any number of interconnect metallization levels may be employed to couple BEOL circuitry to the underlying FEOL device circuitry. In the example shown in FIG. 21, metallization levels of BEOL circuitry (e.g., M8) may be routed down through any number of metallization levels (e.g., M8-M3) to be in electrical communication with one or more FEOL transistors 1281.

In other embodiments, a 3DIC may include one or more levels of the BEOL device circuitry without any monocrystalline FEOL transistors. For such embodiments, the BEOL devices may be over any substrate (e.g., polymer, glass, etc.). Hence, transistors with metal chalcogenide channels may be employed in conjunction with monocrystalline channeled devices, or not.

Figure 13:
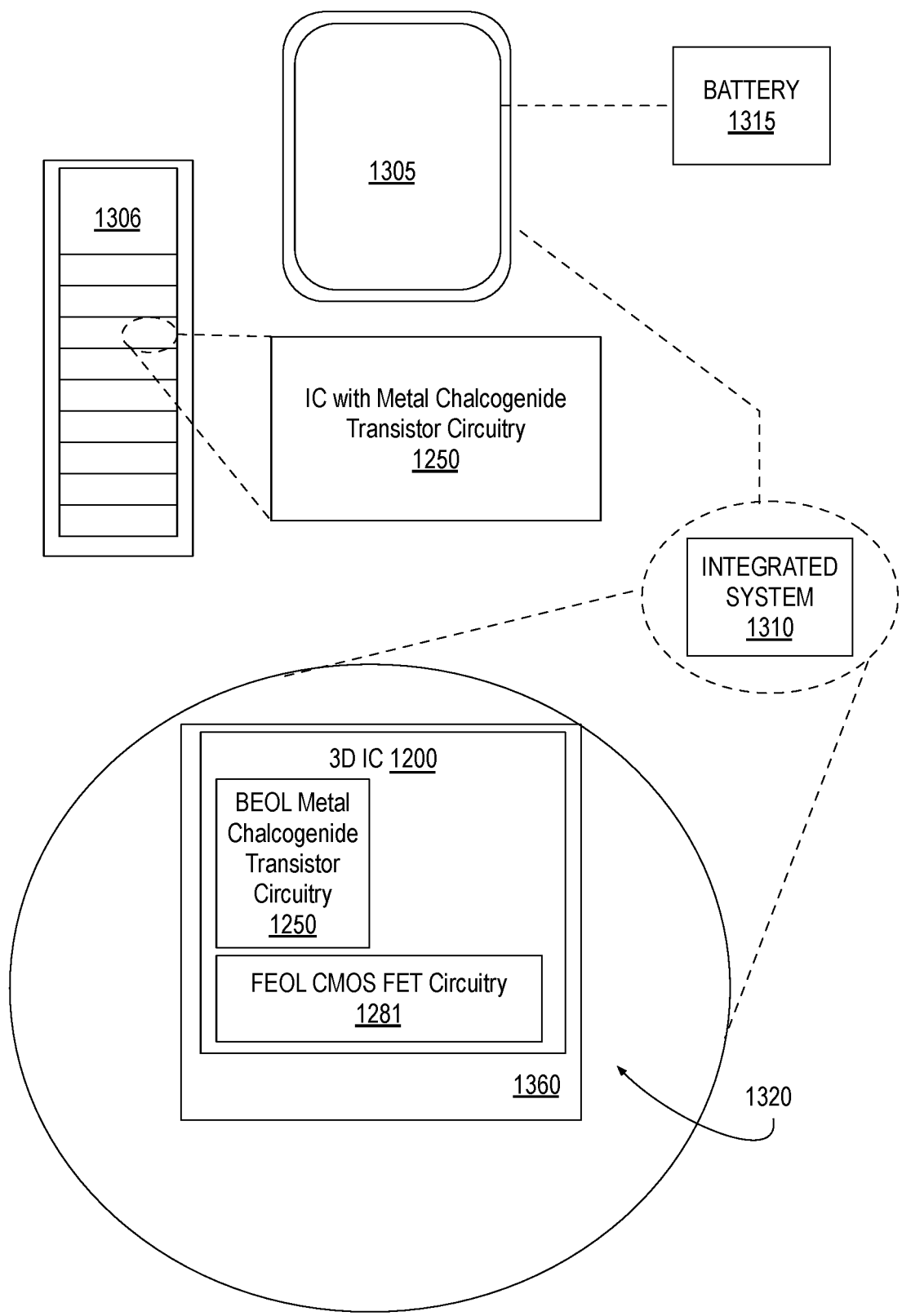
FIG. 13 illustrates a system employing an IC including metal chalcogenide transistor circuitry over CMOS FET circuitry, in accordance with some embodiments.

FIG. 13 illustrates a system in which a mobile computing platform 1305 and/or a data server machine 1306 employs an IC including at least one back-end metal chalcogenide semiconductor device, which may be over a front-end semiconductor device, in accordance with some embodiments. The server machine 1306 may be any commercial server, for example including any number of high-performance computing platforms disposed within a rack and networked together for electronic data processing. The mobile computing platform 1305 may be any portable device configured for each of electronic data display, electronic data processing, wireless electronic data transmission, or the like. For example, the mobile computing platform 1305 may be any of a tablet, a smart phone, laptop computer, etc., and may include a display screen (e.g., a capacitive, inductive, resistive, or optical touchscreen), a chip-level or package-level integrated system 1310, and a battery 1315.

Whether disposed within the integrated system 1310 illustrated in the expanded view 1320, or as a stand-alone packaged chip within the server machine 1306, at least one of a memory chip (e.g., DRAM) or a processor chip (e.g., a microprocessor, a multi-core microprocessor, graphics processor, or the like) includes at least one metal chalcogenide semiconductor device, for example as 3D IC 1200 described elsewhere herein. In some exemplary embodiments, integrated system 1310 includes 3D IC 1200 affixed to a board or package substrate 1360. 3D IC 1200 further comprises FEOL CMOS FET circuitry 1281 and BEOL metal chalcogenide transistor circuitry 1250.

Figure 14:
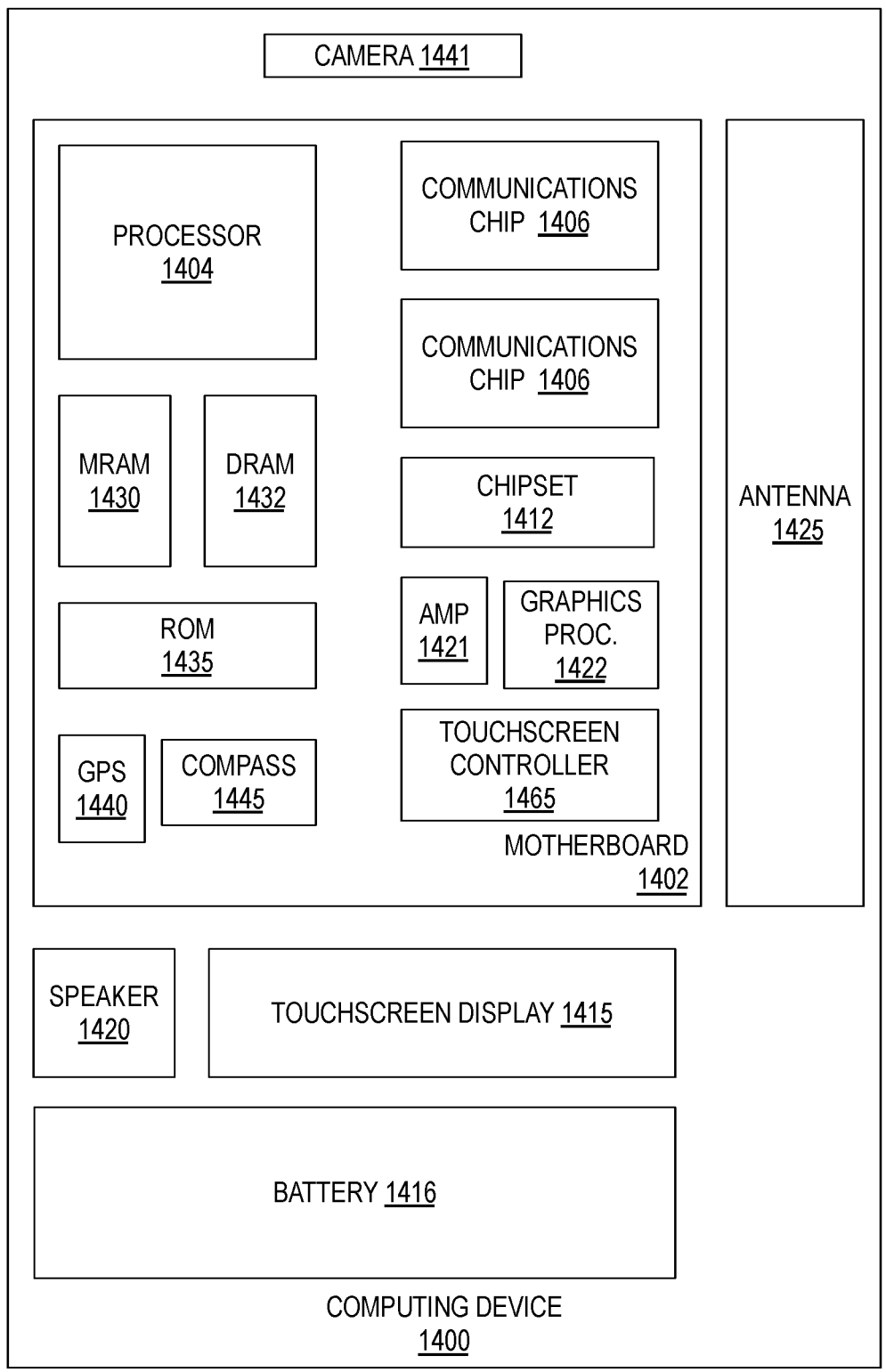
FIG. 14 is a functional block diagram illustrating an electronic computing device, in accordance with an embodiment.

FIG. 14 is a functional block diagram of an electronic computing device 1400, in accordance with some embodiments. Device 1400 further includes a motherboard 1402 hosting a number of components, such as, but not limited to, a processor 1404 (e.g., an applications processor). Processor 1404 may be physically and/or electrically coupled to motherboard 1402. In some examples, processor 1404 includes 3D IC structure 1200, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1406 may also be physically and/or electrically coupled to the motherboard 1402. In further implementations, communication chips 1406 may be part of processor 1404. Depending on its applications, computing device 1400 may include other components that may or may not be physically and electrically coupled to motherboard 1402. These other components include, but are not limited to, volatile memory (e.g., DRAM 1432), non-volatile memory (e.g., ROM 1435), flash memory (e.g., NAND or NOR), magnetic memory (MRAM 1430), a graphics processor 1422, a digital signal processor, a crypto processor, a chipset 1412, an antenna 1425, touchscreen display 1415, touchscreen controller 1465, battery 1416, audio codec, video codec, power amplifier 1421, global positioning system (GPS) device 1440, compass 1445, accelerometer, gyroscope, speaker 1420, camera 1441, and mass storage device (such as hard disk drive, solid-state drive (SSD), compact disk (CD), digital versatile disk (DVD), and so forth), or the like. In some exemplary embodiments, at least one of the functional blocks noted above comprise an IC including a transistor structure with a back-side contact metallization to deep source and/or drain semiconductor for example as described elsewhere herein.

Communication chips 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1406 may implement any of a number of wireless standards or protocols, such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the disclosure is not limited to the embodiments so described, but can be practiced with modification and alteration without departing from the scope of the appended claims. For example, the above embodiments may include specific combinations of features as further provided below.

In first examples, an integrated circuit (IC) comprising a plurality of transistor structures. Individual ones of the transistor structures occupy an area over a substrate. Within the area, the each of transistor structures comprises a channel region comprising a monocrystalline metal chalcogenide. A template region is in direct contact with the channel region. The template region has a chemical composition distinct from the channel region. A source terminal, a drain terminal, and a gate terminal are electrically coupled to the channel region.

In second examples, for any of the first examples the template region comprises a metal also present in the metal chalcogenide.

In third examples, for any of the first through second examples the template region comprises predominantly oxygen and the metal.

In fourth examples, for any of the third examples the metal is Mo, W, Zn, Cu, Cd, Ni, Co, Pd, Pt, Ti, Cr, V, Al, Sn, Ga, or In.

In fifth examples, for any of the first through fourth examples the template regions for the plurality of transistors have a pitch over the substrate material that is substantially the same as a pitch of at least one of the channel region, the source terminal, the drain terminal, or the gate terminal.

In sixth examples, for any of the first through fifth examples at least one of the source terminal or the drain terminal is electrically coupled to the channel region through only the template region.

In seventh examples, for any of the first through sixth examples the template region is in direct contact with an amorphous material layer of the substrate.

In eighth examples, for any of the seventh examples the template region comprises the amorphous material layer, and the template region comprises a number of defects of a threshold minimum dimension that exceeds the number of such defects within the amorphous material layer outside of the template region.

In ninth examples, for any of the first through eighth examples an in-plane crystal orientation of the metal chalcogenide varies across the plurality of transistor structures.

In tenth examples, for any of the first through ninth examples the metal chalcogenide has a thickness less than 10 nm, and the source terminal is separated from a drain terminal by a channel length that exceeds the thickness.

In eleventh examples, an integrated circuit (IC), comprises a plurality of complementary metal-oxide-semiconductor (CMOS) field effect transistor (FET) structures. Individual ones of the CMOS FET structures comprise a Group IV semiconductor material, The IC comprises a plurality of back-end transistor structures over the CMOS FET structures, with one or more levels of interconnect metallization therebetween. Individual ones of the back-end transistor structures comprise the transistor structure of any of the first through tenth examples.

In twelfth examples, a method of fabricating a transistor structure comprises forming a plurality of template regions over the substrate, growing a monocrystalline metal chalcogenide preferentially from each of the template regions, defining a plurality of channel regions by patterning the metal chalcogenide, and forming a source terminal, a drain terminal, and a gate terminal electrically coupled to individual ones of the channel regions.

In thirteenth examples, for any of the twelfth examples forming the template regions further comprises at least one of patterning a metal precursor, a growth promoter, a growth inhibitor, or a defected region.

In fourteenth examples, for any of the thirteenth examples the method further comprises forming a plurality of substrate structures within a substrate, and patterning nanometer-dimensioned features in the metal precursor, the growth promoter, the growth inhibitor, or the defected region with a mask aligned to one or more of the substrate structures.

In fifteenth examples, for any of the fourteenth examples forming the substrate structures comprises forming at least one of the source terminal, the drain terminal or the gate terminal.

In sixteenth examples, for any of the fourteenth examples forming the template regions further comprises patterning a metal precursor. Patterning the precursor material comprises depositing the precursor material over the substrate. The metal precursor comprises predominantly oxygen and a metal. The patterning comprises subtractively patterning the metal precursor into nanometer-dimensioned template regions, and growing the monocrystalline metal chalcogenide comprises consuming at least a portion of the metal precursor through chalcogenation with a vapor-phase precursor of the chalcogenide.

In seventeenth examples, for any of the sixteenth examples depositing and patterning the precursor material further comprises depositing a first precursor material comprising predominantly oxygen and a first metal, patterning the first precursor material into a first plurality of the template regions, depositing a second metal precursor comprising predominantly oxygen and a second metal, patterning the second metal precursor into a second plurality of the template regions. Growing the monocrystalline metal chalcogenide comprises growing a first monocrystalline metal chalcogenide by consuming at least a portion of the first metal precursor through the chalcogenation, and growing a second monocrystalline metal chalcogenide by consuming at least a portion of the second metal precursor through the chalcogenation. Defining the plurality of channel regions comprises defining an n-type channel region by patterning the first monocrystalline metal chalcogenide, and defining a p-type channel region by patterning the second monocrystalline metal chalcogenide.

In eighteenth examples, for any of the sixteenth through seventeenth examples the metal is Mo, W, Zn, Cu, Cd, Ni, Co, Pd, Pt, Ti, Cr, V, Al, Sn, Ga, or In, and the vapor-phase precursor is $H_2S$, $H_2Se$, or $H_2Te$.

In nineteenth examples, for any of the thirteenth examples forming the template regions comprises patterning nanometer-dimensioned openings in a mask over the substrate, inducing defects within a portion of the substrate surface by exposing the openings to a plasma or other ion source, removing the mask, and growing the monocrystalline metal chalcogenide comprises exposing the substrate surface to a vapor-phase or liquid-phase precursor of the metal and a vapor-phase or liquid-phase precursor of the chalcogenide.

In twentieth examples, for any of the thirteenth examples forming the template regions comprises depositing the growth promoter or inhibitor over a surface of the substrate, patterning the growth promoter or inhibitor into nanometer-dimensioned features, and growing the monocrystalline metal chalcogenide comprises exposing the substrate surface to a vapor-phase or liquid-phase precursor of the metal and a vapor-phase or liquid-phase precursor of the chalcogenide.

In twenty-first examples, for any of the twentieth examples the growth promoter comprises at least one of perylene-3,4,9,10-tetracarboxylic acid tetrapotassium salt (PTAS), an alkali metal halide, or sodium cholate.

In twenty-second examples, for any of the twentieth examples the growth inhibitor comprises a self-assembled monolayer (SAM) that attaches preferentially to a surface of the substrate.

In twenty-third examples, for any of the thirteenth examples forming the template regions comprises patterning a defected region, an patterning the defected region further comprises masking a portion of the substrate and forming the defected region within unmasked portions of the substrate by exposing the unmasked portions to a flux of ions.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed.

What is claimed is:

1. An integrated circuit (IC), comprising:
    a plurality of transistor structures, wherein individual ones of the transistor structures occupy an area over a substrate, and wherein within the area, each of the transistor structures comprises:
        a channel region, wherein the channel region comprises a monocrystalline metal chalcogenide;
        a template region comprising a metal and oxygen, wherein the template region comprises a sidewall in direct contact with the channel region, wherein the template region has a chemical composition distinct from the channel region;
        and
        a source terminal, a drain terminal, and a gate terminal electrically coupled to the channel region.

2. The IC of claim 1, wherein the metal in the template region is also present in the metal chalcogenide.

3. The IC of claim 1, wherein the template region comprises $WO_x$, W, Mo, or Cu.

4. The IC of claim 1, wherein the channel region comprises Mo, W, Zn, Cu, Cd, Ni, Co, Pd, Pt, Ti, Cr, V, Al, Sn, Ga, or In.

5. The IC of claim 1, wherein a plurality of template regions corresponding to the plurality of transistors has a pitch over the substrate that is substantially equal to a pitch of at least one of the channel region, the source terminal, the drain terminal, or the gate terminal of the plurality of transistors.

6. The IC of claim 1, wherein the source terminal or the drain terminal is electrically coupled to the channel region through only the template region.

7. The IC of claim 1, wherein the template region is in direct contact with an amorphous material layer of the substrate and at least a portion of the channel region is over, and in direct contact with, the amorphous material layer.

8. The IC of claim 1, wherein an in-plane crystal orientation of the metal chalcogenide varies across the plurality of transistor structures.

9. The IC of claim 1, wherein the metal chalcogenide has a thickness less than 10 nm, and the source terminal is separated from a drain terminal by a channel length that exceeds the thickness.

10. An integrated circuit (IC), comprising:
   a plurality of complementary metal-oxide-semiconductor (CMOS) field effect transistor (FET) structures, wherein individual ones of the CMOS FET structures comprise a Group IV semiconductor material; and
   a plurality of back-end transistor structures over the CMOS FET structures, with one or more levels of interconnect metallization therebetween, wherein individual ones of the back- end transistor structures comprise the transistor structure of claim 1.

11. The IC of claim 1, wherein the template region is electrically conductive.

12. The IC of claim 1, wherein the source terminal or the drain terminal is in direct contact with the template region.

* * * * *